(12) United States Patent
Cho et al.

(10) Patent No.: US 12,185,593 B2
(45) Date of Patent: Dec. 31, 2024

(54) DISPLAY DEVICE AND METHOD OF MANUFACTURING THE DISPLAY DEVICE

(71) Applicant: Samsung Display Co., Ltd., Yongin-Si (KR)

(72) Inventors: Hyunmin Cho, Yongin-si (KR); Taesung Kim, Yongin-si (KR); Yunjong Yeo, Yongin-si (KR); Sanggab Kim, Yongin-si (KR); Daewon Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/224,083

(22) Filed: Jul. 20, 2023

(65) Prior Publication Data

US 2023/0363210 A1    Nov. 9, 2023

Related U.S. Application Data

(62) Division of application No. 17/369,877, filed on Jul. 7, 2021, now Pat. No. 11,751,435.

(30) Foreign Application Priority Data

Dec. 2, 2020 (KR) .................. 10-2020-0166928

(51) Int. Cl.
*H10K 59/122* (2023.01)
*H10K 50/813* (2023.01)
(Continued)

(52) U.S. Cl.
CPC ......... *H10K 59/122* (2023.02); *H10K 50/813* (2023.02); *H10K 50/822* (2023.02); *H10K 71/00* (2023.02); *H10K 2102/351* (2023.02)

(58) Field of Classification Search
None
See application file for complete search history.

(56) References Cited

U.S. PATENT DOCUMENTS 7,573,070 B2    8/2009    Kang et al.
7,829,890 B2    11/2010    Cho et al.
(Continued)

FOREIGN PATENT DOCUMENTS

CN    001509127 A    6/2004
JP    2004-192935 A    7/2004
(Continued)

*Primary Examiner* — Michelle Mandala
(74) *Attorney, Agent, or Firm* — Innovation Counsel LLP

(57) ABSTRACT

An embodiment of a display device includes a substrate including a display area; an organic layer and having a protrusion protruding in a thickness direction of the substrate and overlapping the display area; a first electrode on the organic layer and overlapping the display area; a pixel defining layer covering the protrusion and an edge of the first electrode and having an opening portion overlapping the first electrode; an emission layer on the first electrode and overlapping the opening portion; and a second electrode on the emission layer, wherein the pixel defining layer includes an inorganic material, and a first distance from an upper surface of the substrate to a lower surface of the first electrode is less than a second distance from the upper surface of the substrate to an upper surface of the protrusion, the lower surface of the first electrode facing the upper surface of the substrate.

8 Claims, 23 Drawing Sheets

(51) Int. Cl.
  *H10K 50/822* (2023.01)
  *H10K 71/00* (2023.01)
  *H10K 102/00* (2023.01)

(56) References Cited

U.S. PATENT DOCUMENTS

| | | |
|---|---|---|
| 8,129,902 B2 | 3/2012 | Kai et al. |
| 8,716,058 B2 | 5/2014 | Choi et al. |
| 9,029,838 B2 | 5/2015 | Lim et al. |
| 9,076,739 B2 | 7/2015 | Choi et al. |
| 9,391,292 B2 | 7/2016 | Choi et al. |
| 10,147,775 B2 | 12/2018 | Kim et al. |
| 10,367,045 B2 | 7/2019 | Yang et al. |
| 10,811,478 B2 | 10/2020 | Choi et al. |
| 2006/0061266 A1 | 3/2006 | Kang et al. |
| 2009/0269038 A1 | 10/2009 | Takakuwa et al. |
| 2013/0001603 A1* | 1/2013 | Lim ............... H10K 59/124 438/34 |
| 2013/0049028 A1* | 2/2013 | Kim ............... H10K 50/818 438/34 |
| 2013/0222726 A1 | 8/2013 | Choi et al. |
| 2015/0280169 A1* | 10/2015 | Choi ............... H10K 50/84 438/38 |
| 2017/0053973 A1 | 2/2017 | Park et al. |
| 2018/0006264 A1 | 1/2018 | Lee |
| 2018/0294323 A1 | 10/2018 | Yang et al. |
| 2019/0348482 A1 | 11/2019 | Bae et al. |
| 2020/0251541 A1 | 8/2020 | Kim et al. |
| 2020/0350382 A1 | 11/2020 | Sim et al. |

FOREIGN PATENT DOCUMENTS

| | | |
|---|---|---|
| JP | 2006-093078 A | 4/2006 |
| JP | 2006-093079 A | 4/2006 |
| JP | 4651680 B2 | 3/2011 |
| KR | 10-1193196 B1 | 10/2012 |
| KR | 10-1258903 B1 | 4/2013 |
| KR | 10-2015-0111544 A | 10/2015 |
| KR | 10-2017-0056770 A | 5/2017 |
| KR | 10-2017-0062596 A | 6/2017 |
| KR | 10-2018-0011982 A | 2/2018 |
| KR | 10-1881133 B1 | 7/2018 |
| KR | 10-2019-0130705 A | 11/2019 |
| KR | 10-2064392 B1 | 1/2020 |
| KR | 10-2020-0014463 A | 2/2020 |
| KR | 10-2020-0096367 A | 8/2020 |

* cited by examiner

FIG. 8C

SOLAR TEST RESULT ACCORDING TO CONDITIONS

| CONDITION | | X | Y | Z | W |
|---|---|---|---|---|---|
| LUMINANCE RATIO (ΔL) ≤ ±10% | Avg. | 101.1% | 93.0% | 98.6% | 99.9% |
| | Min. | 100.0% | 72.1% | 93.7% | 99.6% |
| COLOR TEMPERATURE DIFFERENCE (ΔT) ≤ ±400K | Avg. | 125k | 459k | 108k | 71k |
| | Min. | 254k | 1299k | 179k | 164k |

FIG. 19

SKEW AND ANGLE ACCORDING TO ETCH SELECTIVITY

| ETCH SELECTIVITY | 1.3 | 1.0 | 0.8 | 0.7 |
|---|---|---|---|---|
| SKEW ( \| int1−int2 \| [μm]) | 1.00 | 0.56 | 0.31 | 0.17 |
| ANGLE (AN[°]) | 21.5 | 31.3 | 38.2 | 48.8 |

DISPLAY DEVICE AND METHOD OF MANUFACTURING THE DISPLAY DEVICE

CROSS-REFERENCE TO RELATED APPLICATION

This application is a divisional application of U.S. patent application Ser. No. 17/369,877, filed on Jul. 7, 2021, now U.S. Pat. No. 11,751,435, which is based on and claims priority under 35 U.S.C. § 119 to Korean Patent Application No. 10-2020-0166928, filed on Dec. 2, 2020, in the Korean Intellectual Property Office, the disclosures of which are incorporated by reference herein in their entireties.

BACKGROUND

1. Field

One or more embodiments relate to a display device and a method of manufacturing the display device.

2. Description of the Related Art

As the information-oriented society develops, the demand for display devices displaying images is increasing in various forms. The field of display devices has rapidly changed to flat-panel display devices (FPD), which are thin, light and may include a large area, replacing bulky cathode ray tubes (CRTs). The FPDs include liquid-crystal display devices (LCDs), plasma display panels (PDPs), organic light-emitting display devices (OLEDs), electrophoretic display devices (EPDs), or the like.

Among display devices, an organic light-emitting display device may include, as a display element, an organic light-emitting diode including an opposite electrode, a pixel electrode, and emission layer. When a voltage is applied to the opposite electrode and the pixel electrode of the organic light-emitting diode, the emission layer may produce visible light. Such an organic light-emitting display device may include a pixel defining layer surrounding an edge of the pixel electrode and exposing a central portion of the pixel electrode.

SUMMARY

According to an embodiment, a display device includes a substrate including a display area, an organic layer on the substrate and having a protrusion protruding in a thickness direction of the substrate and overlapping the display area, a first electrode on the organic layer and overlapping the display area, a pixel defining layer covering the protrusion and an edge of the first electrode and having an opening portion overlapping a central portion of the first electrode, an emission layer on the first electrode and overlapping the opening portion, and a second electrode on the emission layer, wherein the pixel defining layer includes an inorganic material, and a first distance from an upper surface of the substrate to a lower surface of the first electrode is less than a second distance from the upper surface of the substrate to an upper surface of the protrusion, the lower surface of the first electrode facing the upper surface of the substrate.

According to an embodiment, the second electrode and the emission layer may be separated from the organic layer by the pixel defining layer.

According to an embodiment, in the display area, an upper surface of the organic layer may be covered by at least one of the first electrode and the pixel defining layer.

According to an embodiment, the display device may further include a pixel circuit layer between the substrate and the organic layer and including at least one thin-film transistor, wherein the organic layer may have a contact hole overlapping the at least one thin-film transistor, and the first electrode may be electrically connected to the at least one thin-film transistor through the contact hole.

According to an embodiment, the pixel defining layer may include an inner side surface defining the opening portion, and an angle between the inner side surface of the pixel defining layer and the upper surface of the substrate may be 40 degrees or less.

According to an embodiment, the substrate may further include a pad area outside the display area, the display device may further include a pad on the substrate and overlapping the pad area, the organic layer may cover an edge of the pad and has a pad opening portion exposing a central portion of the pad, and a third distance from the upper surface of the substrate to an upper surface of the organic layer in the pad area may be less than the first distance.

According to an embodiment, the first electrode may further include an outer portion overlapping the pixel defining layer and including an edge of the first electrode, and a thickness of the first electrode in the central portion of the first electrode may be less than a thickness of the first electrode in the outer portion of the first electrode.

According to an embodiment, the pixel defining layer may include at least one of silicon nitride ($SiN_x$) and silicon oxide ($SiO_2$).

According to an embodiment, the organic layer may consist essentially of an acrylic polymer.

In an embodiment, a plurality of protrusions and a plurality of opening portions may be respectively arranged in the display area, the plurality of protrusions may be apart from each other, and the plurality of opening portions may be between the plurality of protrusions, which are adjacent to each other.

According to another embodiment, a method of manufacturing a display device includes forming, on a substrate including a display area, an organic layer having a protrusion protruding in a thickness direction of the substrate and overlapping the display area, forming a first electrode on the organic layer to overlap the display area, forming a pixel defining layer covering the protrusion and an edge of the first electrode and having an opening portion overlapping a central portion of the first electrode, forming an emission layer overlapping the opening portion, and forming a second electrode on the emission layer, wherein the pixel defining layer includes an inorganic material.

According to an embodiment, a first distance from an upper surface of the substrate to a lower surface of the first electrode may be less than a second distance from the upper surface of the substrate to an upper surface of the protrusion, the lower surface of the first electrode facing the upper surface of the substrate.

According to an embodiment, the substrate may further include a pad area outside the display area, the forming of the organic layer may include forming a first layer including an organic material on the substrate, arranging a mask on the first layer, the mask including a transparent portion, a light-blocking portion, a first semi-transparent portion, and a second semi-transparent portion having a different light transmittance from that of the first semi-transparent portion, and exposing the first layer to light, the first semi-transparent portion may be in the display area, and the second semi-transparent portion may be in the pad area.

According to an embodiment, a first distance from an upper surface of the substrate to a lower surface of the first electrode may be less than a second distance from the upper surface of the substrate to an upper surface of the protrusion, the lower surface of the first electrode facing the upper surface of the substrate, and a third distance from the upper surface of the substrate to an upper surface of the organic layer in the pad area may be less than the first distance.

According to an embodiment, the forming of the second electrode may include forming the second electrode on the pixel defining layer on the protrusion.

According to an embodiment, the first electrode may be formed after forming the organic layer.

According to an embodiment, the pixel defining layer may include an inner side surface defining the opening portion, and the forming of the pixel defining layer may include forming an angle between the inner side surface of the pixel defining layer and an upper surface of the substrate to be 40 degrees or less.

According to an embodiment, the forming of the pixel defining layer may include forming an inorganic layer on the first electrode and the organic layer, forming the opening portion by etching the inorganic layer, and etching at least a portion of the central portion of the first electrode.

According to an embodiment, the pixel defining layer may include at least one of silicon nitride ($SiN_x$) and silicon oxide ($SiO_2$).

According to an embodiment, the organic layer may consist essentially of an acrylic polymer.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 8C is a table showing a solar test according to conditions;

FIG. 19 is a table showing a skew and an angle according to an etch selectivity.

DETAILED DESCRIPTION

Figure 1:
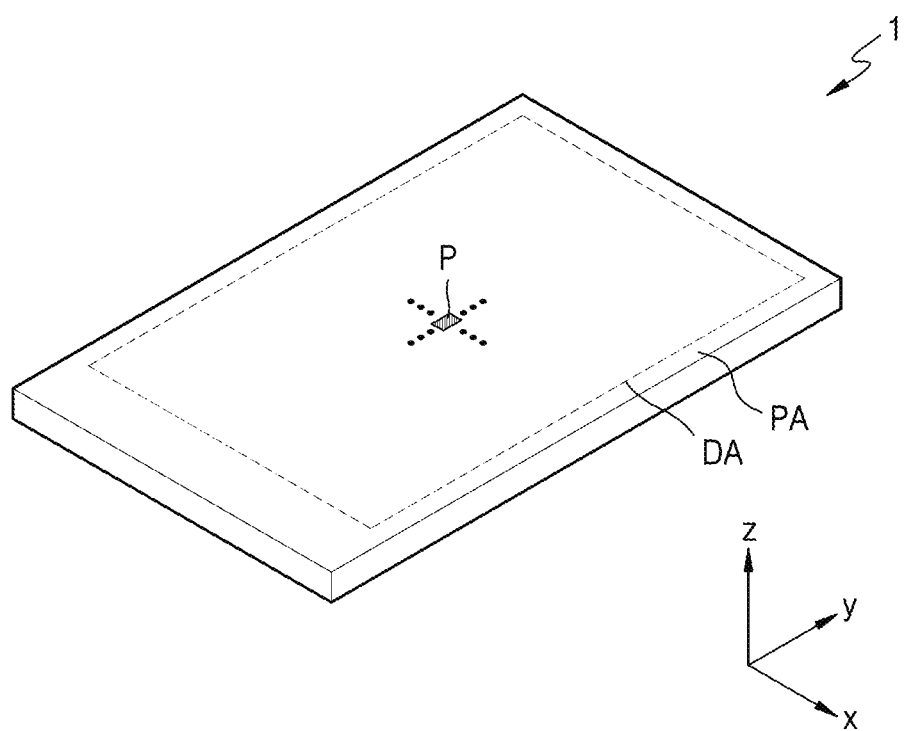
FIG. 1 is a schematic perspective view of a display device according to an embodiment.

Embodiments of the present disclosure include a display device in which a lifespan of a display element is increased, and a method of manufacturing the display device.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the word "or" means logical "or" so that the expression "A, B, or C" means "A and B and C," "A and B but not C," "A and C but not B," "B and C but not A," "A but not B and not C," "B but not A and not C," and "C but not A and not B." Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. Effects and features of the present disclosure and methods of achieving the same will be apparent with reference to embodiments and drawings described below in detail. The present disclosure may, however, be embodied in many different forms and should not be construed as being limited to the exemplary embodiments set forth herein.

The disclosure will now be described more fully with reference to the accompanying drawings, in which embodiments of the disclosure are shown. Like reference numerals in the drawings denote like elements, and thus their description will be omitted.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the present disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

A display device is a device displaying an image, and may include a portable mobile device, such as a game machine, a multimedia device, and a micro personal computer (PC). The display device to be described below may include a liquid-crystal display device, an electrophoretic display device, an inorganic electroluminescent (EL) display device (inorganic light-emitting display device), a field emission display device, a surface-conduction electron-emitter display device, a quantum dot display device, a plasma display device, a cathode ray display device, or the like. Hereinafter, although an organic light-emitting device is described as an example of the display device according to an embodiment, various types of display devices stated above may be used in one or more embodiments.

FIG. 1 is a schematic perspective view of a display device 1 according to an embodiment.

Referring to FIG. 1, the display device 1 may include a display area DA and a peripheral area PA. A sub-pixel P may be arranged in the display area DA. In an embodiment, a plurality of sub-pixels P may be arranged in the display area DA. Each of the plurality of sub-pixels P may include a display element. The display device 1 may provide an image by using light emitted from the sub-pixel P.

The sub-pixel P may include a light-emitting diode as a display element capable of emitting light of a certain color. The light-emitting diode may include an organic light-emitting diode including an organic material as an emission layer. Alternatively, the light-emitting diode may include an inorganic light-emitting diode. Alternatively, the light-emitting diode may include quantum dots as an emission layer. Hereinafter, for convenience of explanation, a case where the light-emitting diode includes an organic light-emitting diode will be mainly described in detail.

The peripheral area PA may be an area that does not provide an image. The peripheral area PA may at least partially surround the display area DA. In an embodiment, the peripheral area PA may entirely surround the display area DA. A driver configured to provide electrical signals or power to the sub-pixel P may be arranged in the peripheral area PA. In addition, the peripheral area PA may include a pad area in which at least one pad is arranged.

Figure 2:
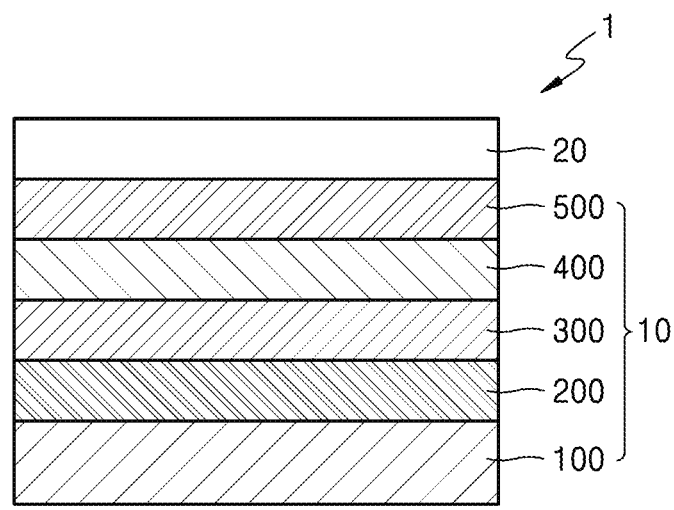
FIG. 2 is a schematic cross-sectional view of a display device according to an embodiment.
Figure 2:
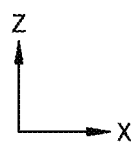

FIG. 2 is a schematic cross-sectional view of the display device 1 according to an embodiment.

Referring to FIG. 2, the display device 1 may include a display panel 10 and a cover window 20. The display panel 10 may include a substrate 100, a display layer 200, an encapsulation layer 300, a touch sensor layer 400, and an anti-reflection layer 500.

The substrate 100 may include a glass or a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. In an embodiment, the substrate 100 may have a multi-layered structure including a base layer, which includes the above-stated polymer resin, and a barrier layer (not shown). The substrate 100 including the polymer resin may be flexible, rollable, or bendable.

The display layer 200 may be arranged on the substrate 100. The display layer 200 may include a pixel circuit layer and a display element layer. The pixel circuit layer may include a plurality of pixel circuits. The display element layer may include a plurality of display elements respectively connected to the plurality of pixel circuits. Each of the plurality of display elements included in the display element layer may be defined as a sub-pixel. The pixel circuit layer may include a plurality of thin-film transistors and a plurality of storage capacitors.

The encapsulation layer 300 may be arranged on the display layer 200. In an embodiment, the encapsulation layer 300 may include at least one inorganic encapsulation layer and at least one organic encapsulation layer. The at least one inorganic encapsulation layer may include at least one inorganic material from among aluminum oxide ($Al_2O_3$), titanium oxide ($TiO_2$), tantalum oxide ($Ta_2O_5$), zinc oxide (ZnO), silicon oxide ($SiO_2$), silicon nitride (SiNg), and silicon oxynitride (SiON). The at least one organic encapsulation layer may include a polymer-based material. The polymer-based material may include an acrylic resin, an epoxy resin, polyimide, polyethylene, or the like. As an embodiment, the at least one organic encapsulation layer may include acrylate.

In another embodiment, the encapsulation layer 300 may have a structure in which the substrate 100 and an upper substrate, which includes a transparent material, are combined with a sealing member to seal an internal space between the substrate 100 and the upper substrate. At this time, a moisture absorbent, a filler, or the like may be located in the internal space. The sealing member may be a sealant, and in another embodiment, the sealing member may include a material that is cured by a laser. For example, the sealing member may be frit. In detail, the sealing member may include a urethane resin, an epoxy resin, an acrylic resin, which are organic sealants, or silicone or the like, which is an inorganic sealant. For example, urethane acrylate or the like may be used as the urethane resin. For example, butyl acrylate, ethyl hexyl acrylate, or the like may be used as the acrylic resin. In addition, the sealing member may include a material that is cured by heat.

The touch sensor layer 400 may be arranged on the encapsulation layer 300. The touch sensor layer 400 is a layer that senses a user's touch input, and may sense the user's touch input by using at least one of various touch methods such as a resistive film method, a capacitive method, or the like.

The anti-reflection layer 500 may be arranged on the touch sensor layer 400. The anti-reflection layer 500 may reduce the reflectance of light (external light) incident from the outside toward the display panel 10.

In some embodiments, the anti-reflection layer 500 may include a polarizing film. The polarizing film may include a linear polarizing plate and a retardation film such as a quarter-wave plate. The retardation film may be arranged above the touch sensor layer 400, and the linear polarizing plate may be arranged above the retardation film.

In some embodiments, the anti-reflection layer 500 may include a filter layer including a black matrix and color filters. The color filters may be arranged by considering a color of light emitted from each of the sub-pixels of the display panel 10. For example, the filter layer may include a red, green, or blue filter.

The cover window 20 may be arranged on the display panel 10. In an embodiment, the cover window 20 may be combined with an underlying component, for example, the anti-reflection layer 500, through an adhesive such as an optically clear adhesive (OCA). The cover window 20 may protect the display panel 10. The cover window 20 may include at least one of glass, sapphire, and plastic. The cover window 20 may be, for example, ultra-thin glass (UTG) or a colorless polyimide (CPI).

Figure 3:
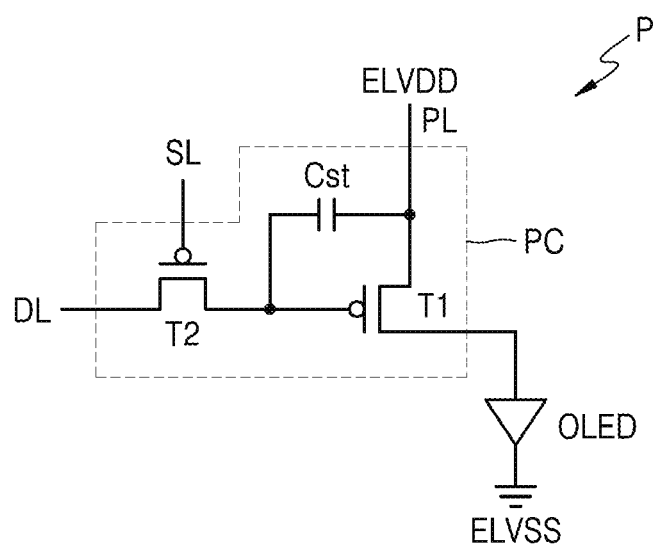
FIG. 3 is a schematic equivalent circuit diagram of a sub-pixel according to an embodiment.

FIG. 3 is a schematic equivalent circuit diagram of the sub-pixel P according to an embodiment.

Referring to FIG. 3, the sub-pixel P may include a pixel circuit PC and an organic light-emitting diode OLED as a display element.

The pixel circuit PC may include a driving thin-film transistor T1, a switching thin-film transistor T2, and a storage capacitor Cst. Each sub-pixel P may emit, for example, red, green, or blue light or may emit red, green, blue, or white light, from the organic light-emitting diode OLED.

The switching thin-film transistor T2 may be connected to a scan line SL and a data line DL, and be configured to provide, to the driving thin-film transistor T1, a data signal or a data voltage input to the data line DL based on a scan signal or a switching voltage input to the scan line SL. The storage capacitor Cst may be connected to the switching thin-film transistor T2 and a driving voltage line PL, and store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control a driving current flowing through the driving voltage line PL to the organic light-emitting diode OLED in accordance with a voltage value stored in the storage capacitor Cst. The organic light-emitting diode OLED may emit light having a certain luminance according to the driving current. An opposite electrode (e.g., a cathode) of the organic light-emitting diode OLED may receive a second power supply voltage ELVSS.

Figure 4:
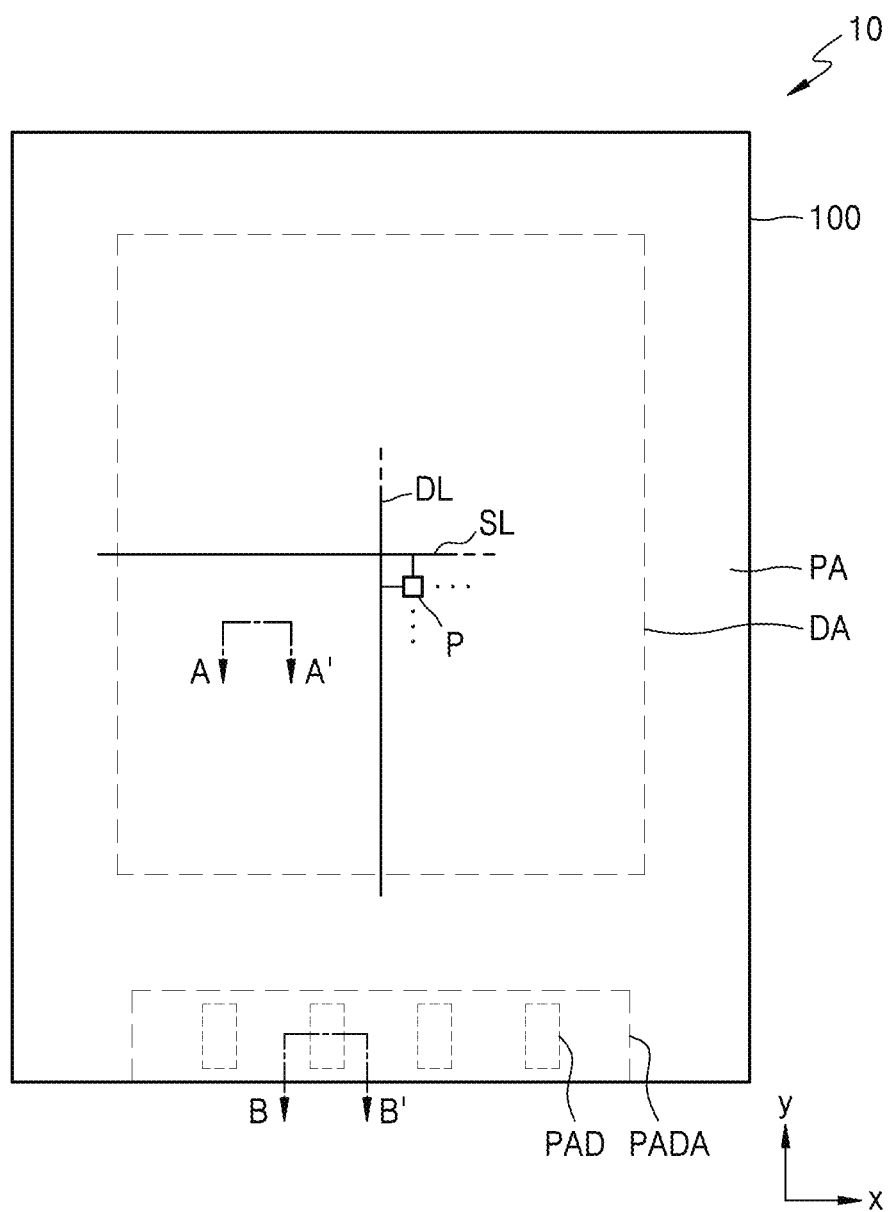
FIG. 4 is a schematic plan view of a display panel according to an embodiment.

FIG. 4 is a schematic plan view of the display panel 10 according to an embodiment.

Referring to FIG. 4, the display panel 10 may include the substrate 100 and a multi-layered film above the substrate 100. The display area DA and the peripheral area PA may be defined on the substrate 100 and/or the multi-layered film. For example, the substrate 100 may include the display area DA and the peripheral area PA. Hereinafter, a case where the display area DA and the peripheral area PA are defined on the substrate 100 will be mainly described in detail.

The sub-pixel P may be arranged in the display area DA, and the plurality of sub-pixels P may display an image. Each of the plurality of sub-pixels P may be connected to the scan line SL extending in a first direction (e.g., an x-direction or an −x-direction) and the data line DL extending in a second direction (e.g., a y-direction or a −y-direction).

The peripheral area PA may be arranged outside the display area DA. The peripheral area PA may at least partially surround the display area DA. In an embodiment, the peripheral area PA may entirely surround the display area DA. A scan driver (not shown) providing a scan signal to each sub-pixel P may be arranged in the peripheral area PA.

A data driver (not shown) providing a data signal to each sub-pixel P may be arranged in the peripheral area PA. The peripheral area PA may include a pad area PADA.

The pad area PADA may be arranged outside the display area DA. In an embodiment, a pad PAD may be arranged in the pad area PADA. The pad PAD may be exposed by not being covered by an insulating layer, and may be electrically connected to a printed circuit board or a driver integrated circuit (IC). Signals or a voltage received from the pad PAD may be provided to the sub-pixel P arranged in the display area DA.

Figure 5A:
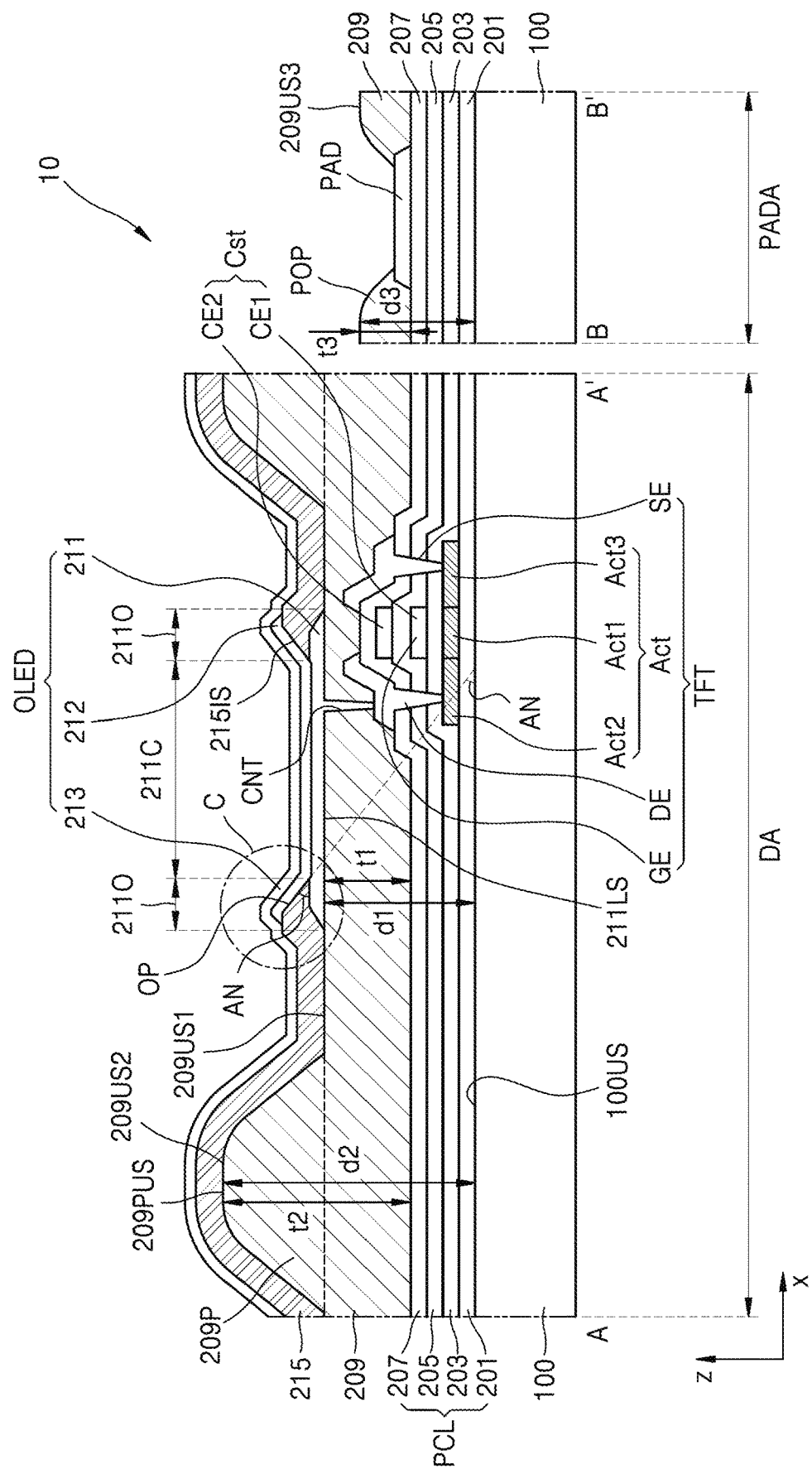
FIG. 5A is a schematic cross-sectional view of a display panel according to an embodiment.
Figure 5B:
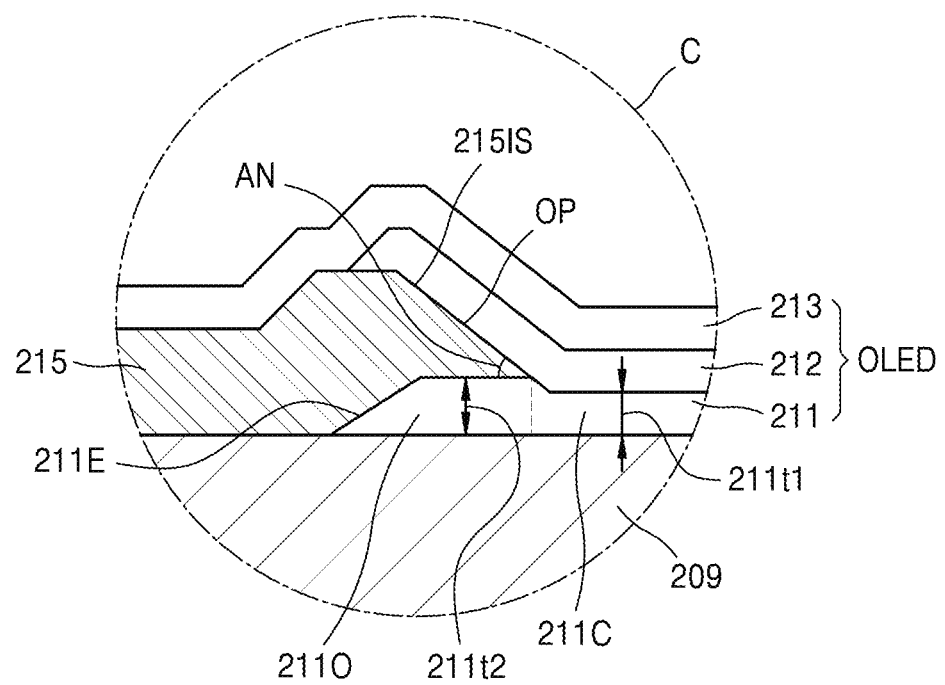
FIG. 5B is an enlarged view of an area C of FIG. 5A.

FIG. 5A is a schematic cross-sectional view of the display panel 10 according to an embodiment. FIG. 5A is a cross-sectional view of the display panel 10 taken along lines A-A' and B-B' of FIG. 4. FIG. 5B is an enlarged view of an area C of FIG. 5A.

Referring to FIGS. 5A and 5B, the display panel 10 may include the substrate 100, a pixel circuit layer PCL, an organic layer 209, the organic light-emitting diode OLED as a display element, a pixel defining layer 215, and the pad PAD.

The substrate 100 may include the display area DA and the pad area PADA. The pad area PADA may be arranged outside the display area DA.

The pixel circuit layer PCL may be arranged on the substrate 100. The pixel circuit layer PCL may include a buffer layer 201, a first gate insulating layer 203, a second gate insulating layer 205, an interlayer insulating layer 207, at least one thin-film transistor TFT, and the storage capacitor Cst. In an embodiment, the at least one thin-film transistor TFT may include a driving thin-film transistor. In an embodiment, the at least one thin-film transistor TFT may include a switching thin-film transistor.

The buffer layer 201 may be arranged on the substrate 100. The buffer layer 201 may include an inorganic insulating material such as silicon nitride ($SiN_x$), silicon oxynitride (SiON), and silicon oxide ($SiO_2$), and may be a single layer or a multi-layer, each including the above-stated inorganic insulating material.

The thin-film transistor TFT may include a semiconductor layer Act, and the semiconductor layer Act may be arranged on the buffer layer 201. The semiconductor layer Act may include polysilicon. Alternatively, the semiconductor layer Act may include an amorphous silicon, an oxide semiconductor, an organic semiconductor, or the like. The semiconductor layer Act may include a channel area Act1, a drain area Act2, and a source area Act3, the drain area Act2 and the source area Act3 being respectively arranged on both sides of the channel area Act1.

A gate electrode GE may overlap the channel area Act1. The gate electrode GE may include a low-resistance metal material. The gate electrode GE may include a conductive material including molybdenum (Mo), aluminum (Al), copper (Cu), titanium (Ti), or the like, and may be a multi-layer or a single layer, each including the above-stated material.

The first gate insulating layer 203 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

The second gate insulating layer 205 may cover the gate electrode GE. Similar to the first gate insulating layer 203, the second gate insulating layer 205 may include an inorganic insulating material such as silicon oxide ($SiO_2$), silicon nitride ($SiN_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO), or the like.

An upper electrode CE2 of the storage capacitor Cst may be arranged on the second gate insulating layer 205. The upper electrode CE2 may overlap the gate electrode GE there below. At this time, the gate electrode GE and the upper electrode CE2 overlapping each other, with the second gate insulating layer 205 arranged therebetween, may form the storage capacitor Cst. That is, the gate electrode GE may function as a lower electrode CE1 of the storage capacitor Cst.

In this way, the storage capacitor Cst and the thin-film transistor TFT may overlap each other. In some embodiments, the storage capacitor Cst may not overlap the thin-film transistor TFT.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or a multi-layer, each including the above-stated material.

The interlayer insulating layer 207 may cover the upper electrode CE2. The interlayer insulating layer 207 may include an inorganic insulating material such as silicon oxide (SiO$_2$), silicon nitride (SiNg), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO), or the like. The interlayer insulating layer 207 may be a single layer or a multi-layer, each including the above-stated inorganic insulating material.

Each of a drain electrode DE and a source electrode SE may be located on the interlayer insulating layer 207. The drain electrode DE and the source electrode SE may be electrically connected to the drain area Act2 and the source area Act3, respectively. The drain electrode DE and the source electrode SE may be electrically connected to the drain area Act2 and the source area Act3, respectively, through a contact hole in the first gate insulating layer 203, the second gate insulating layer 205, and the interlayer insulating layer 207. The drain electrode DE and the source electrode SE may include a material having good conductivity. The drain electrode DE and the source electrode SE may include a conductive material such as Mo, Al, Cu, Ti, or the like, and may include a multi-layer or a single layer, each including the above material. As an embodiment, the drain electrode DE and the source electrode SE may have a multi-layered structure of Ti/Al/Ti.

The organic layer 209 may cover the drain electrode DE and the source electrode SE. The organic layer 209 may be arranged above the substrate 100. The organic layer 209 may have a protrusion 209P protruding in a thickness direction of the substrate 100. The protrusion 209P may overlap the display area DA. The protrusion 209P may protrude in the thickness direction of the substrate 100 in the display area DA. For example, the protrusion 209P may protrude in a z-direction of FIG. 5A.

The protrusion 209P may be apart from a first electrode 211 of the organic light-emitting diode OLED. In an embodiment, a plurality of protrusions 209P may be provided in the display area DA. In this case, the first electrode 211 of the organic light-emitting diode OLED may be arranged between the plurality of protrusions 209P.

A first distance d1 from an upper surface 100US of the substrate 100 to a first upper surface 209US1 of the organic layer 209, on which the first electrode 211 of the organic light-emitting diode OLED is arranged, may be less than a second distance d2 from the upper surface 100US of the substrate 100 to an upper surface 209PUS of the protrusion 209P. The upper surface 100US of the substrate 100 may be a surface of the substrate 100, the surface facing the organic light-emitting diode OLED. The first upper surface 209US1 of the organic layer 209 may be a surface of the organic layer 209, the surface facing the first electrode 211 of the organic light-emitting diode OLED. The first distance d1 may be a distance in the z-direction from the upper surface 100US of the substrate 100 to the first upper surface 209US1 of the organic layer 209 on which the first electrode 211 of the organic light-emitting diode OLED is arranged. The upper surface 209PUS of the protrusion 209P may be an upper surface of the protrusion 209P farthest from the substrate 100. The upper surface 209PUS of the protrusion 209P may be a second upper surface 209US2 of the organic layer 209 in the protrusion 209P. The second distance d2 may be a distance in the z-direction from the upper surface 100US of the substrate 100 to the upper surface 209PUS of the protrusion 209P.

In an embodiment, a first thickness t1 of the organic layer 209, on which the first electrode 211 of the organic light-emitting diode OLED is arranged, may be less than a second thickness t2 of the organic layer 209 in the protrusion 209P. The first thickness t1 is an average distance between an upper surface of the interlayer insulating layer 207 and the first upper surface 209US1 of the organic layer 209 in the z-direction. The second thickness t2 may be a maximum distance between the upper surface of the interlayer insulating layer 207 and an end portion of the protrusion 209P in the z-direction. Accordingly, the protrusion 209P may function as a spacer.

The organic layer 209 including the protrusion 209P may prevent damage of the substrate 100 and/or a multi-layered film on the substrate 100 in a method of manufacturing a display device and/or the display panel 10. The method of manufacturing the display panel 10 may use a mask sheet. For example, when a deposition material is deposited on the substrate 100 and/or the multi-layered film on the substrate 100, the mask sheet may be adhered to the substrate 100 and/or the multi-layered film on the substrate 100. In this case, the substrate 100 and/or the multi-layered film on the substrate 100 may be damaged or destroyed by the mask sheet. In an embodiment of the present disclosure, the organic layer 209 may include the protrusion 209P as a spacer to prevent or reduce the substrate 100 and/or the multi-layered film on the substrate 100 from being damaged. In addition, in an embodiment of the present disclosure, the protrusion 209P, as the spacer, may be formed in an operation of forming the organic layer 209.

The organic layer 209 may have a contact hole CNT overlapping the thin-film transistor TFT. The contact hole CNT may expose at least a portion of the thin-film transistor TFT. For example, the contact hole CNT may expose any one of the source electrode SE and the drain electrode DE. The organic light-emitting diode OLED may be electrically connected to the thin-film transistor TFT through the contact hole CNT of the organic layer 209.

The organic layer 209 may include a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and a mixture thereof. In an embodiment, the organic layer 209 may include photosensitive polyimide (PSPI). In an embodiment, when the organic layer 209 includes an acrylic polymer, a cost of manufacturing a display device and/or the display panel 10 may be reduced.

The organic light-emitting diode OLED may be arranged on the organic layer 209. In an embodiment, the first electrode 211 of the organic light-emitting diode OLED may be apart from the protrusion 209P of the organic layer 209. The organic light-emitting diode OLED may emit red, green, or blue light, or may emit red, green, blue, or white light. The organic light-emitting diode OLED may include the first electrode 211, an emission layer 212, and a second electrode 213. The first electrode 211 may be a pixel electrode of the organic light-emitting diode OLED. The second electrode 213 may be an opposite electrode of the organic light-emitting diode OLED.

The first electrode 211 may be arranged on the organic layer 209. The first electrode 211 may be electrically connected to the source electrode SE or the drain electrode DE through the contact hole CNT of the organic layer 209.

The first electrode 211 may include a lower surface 211LS of the first electrode 211, the lower surface 211LS facing the upper surface 100US of the substrate 100. In an embodiment, the first distance d1 may be defined as a distance from the upper surface 100US of the substrate 100 to the lower surface 211LS of the first electrode 211. In this case, the first distance d1 may be less than the second distance d2. That is, the upper surface 209PUS of the protrusion 209P may be farther away from the upper surface 100US of the substrate 100 than the lower surface 211LS of the first electrode 211.

The first electrode 211 may include a central portion 211C and an outer portion 211O. The central portion 211C of the first electrode 211 may be integrally provided with the outer portion 211O of the first electrode 211. The central portion 211C of the first electrode 211 may overlap an opening portion OP of the pixel defining layer 215 to be described below. The outer portion 211O of the first electrode 211 may surround the central portion 211C of the first electrode 211. The outer portion 211O of the first electrode 211 may include an edge 211E of the first electrode 211.

Referring to FIG. 5B, a thickness 211t1 of the central portion 211C of the first electrode 211 may be less than a thickness 211t2 of the outer portion 211O of the first electrode 211. For example, a difference between the thickness 211t1 of the central portion 211C of the first electrode 211 and the thickness 211t2 of the outer portion 211O of the first electrode 211 may be about 10 Å or less. The central portion 211C of the first electrode 211 may be at least partially etched when forming the opening portion OP of the pixel defining layer 215 to be described below. Accordingly, the thickness 211t1 of the central portion 211C of the first electrode 211 may be less than the thickness 211t2 of the outer portion 211O of the first electrode 211. In another embodiment, the thickness 211t1 of the central portion 211C of the first electrode 211 may be substantially the same as the thickness 211t2 of the outer portion 211O of the first electrode 211.

The first electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). As another embodiment, the first electrode 211 may include a reflective film including Ag, Mg, Al, Pt, Pd, Au, Ni, Nd, Ir, Cr, or a compound thereof. As another embodiment, the first electrode 211 may further include a film including ITO, IZO, ZnO, or $In_2O_3$ above/below the reflective film stated above. For example, the first electrode 211 may have a multi-layered structure of ITO/Ag/ITO.

The pixel defining layer 215 may be arranged on the organic layer 209. The pixel defining layer 215 may cover the organic layer 209 and the edge 211E of the first electrode 211. In an embodiment, the pixel defining layer 215 may cover the outer portion 211O of the first electrode 211. Accordingly, the pixel defining layer 215 may overlap the outer portion 211O of the first electrode 211. When the first electrode 211 has a multi-layered structure of ITO/Ag/ITO, the pixel defining layer 215 may cover the edge 211E of the first electrode 211 to prevent oxidation of Ag.

The pixel defining layer 215 may extend along the first upper surface 209US1 of the organic layer 209. The pixel defining layer 215 may cover the protrusion 209P of the organic layer 209. The pixel defining layer 215 may extend along the upper surface 209PUS of the protrusion 209P. The pixel defining layer 215 may extend from the first upper surface 209US1 of the organic layer 209 to the second upper surface 209US of the organic layer 209.

The pixel defining layer 215 may have the opening portion OP overlapping the central portion 211C of the first electrode 211. The opening portion OP of the pixel defining layer 215 may expose the central portion 211C of the first electrode 211. Accordingly, the pixel defining layer 215 may define an emission area of light emitted from the organic light-emitting diode OLED. In an embodiment, a width of the opening portion OP may correspond to a width of the emission area, and a size of a sub-pixel may be defined by the width of the opening portion OP. The opening portion OP of the pixel defining layer 215 may be defined by an inner side surface 215IS of the pixel defining layer 215. A portion of the inner side surface 215IS of the pixel defining layer 215 and the other portion of the inner side surface 215IS of the pixel defining layer 215 may face each other.

An angle AN formed by the inner side surface 215IS of the pixel defining layer 215 and the upper surface 100US of the substrate 100 may be 40 degrees or less. When the angle AN is 0 degrees, the pixel defining layer 215 may not be defined. When the angle AN is greater than 40 degrees, the possibility that at least one of the emission layer 212 and the second electrode 213, which cover the pixel defining layer 215, is short-circuited may increase. In some embodiments, the angle AN may be defined as an angle between the inner side surface 215IS of the pixel defining layer 215 and an upper surface of the first electrode 211.

The pixel defining layer 215 may include an inorganic material. The pixel defining layer 215 may include an inorganic insulating material such as silicon nitride ($SiN_x$), silicon oxynitride (SiON), and silicon oxide ($SiO_2$), and may be a single layer or a multi-layer, each including the above-stated inorganic insulating material. The pixel defining layer 215 may include an inorganic material to prevent deterioration of the organic light-emitting diode OLED.

In the display area DA, the first upper surface 209US1 of the organic layer 209 may be covered by at least one of the first electrode 211 and the pixel defining layer 215. That is, in the display area DA, at least one of the first electrode 211 and the pixel defining layer 215 may be arranged on the first upper surface 209US1 of the organic layer 209. In addition, in the display area DA, the second upper surface 209US2 of the organic layer 209 may be covered by the pixel defining layer 215. Accordingly, even when outgassing occurs inside the organic layer 209, an outgassing gas may be prevented or reduced from passing through the first upper surface 209US1 of the organic layer 209 and the second upper surface 209US2 of the organic layer 209 in the display area DA.

The emission layer 212 may be arranged on the first electrode 211. In an embodiment, the emission layer 212 may overlap the opening portion OP of the pixel defining layer 215. In an embodiment, the emission layer 212 may extend along the inner side surface 215IS of the pixel defining layer 215. The emission layer 212 may include a polymer organic material or a low-molecular-weight organic material which emits light of a color.

Although not illustrated in FIG. 5A, a first functional layer and a second functional layer may be respectively arranged below or above the emission layer 212. The first functional layer may include, for example, a hole transport layer (HTL) or may include an HTL and a hole injection layer (HIL). The second functional layer, as a component arranged above the emission layer 212, is optional. The second functional layer may include an electron transport layer (ETL) and/or an electron injection layer (EIL). Similar to the second electrode 213 to be described below, the first functional layer and/or the second functional layer may be a common layer entirely covering the substrate 100.

Unlike an embodiment of the present disclosure, when a pixel defining layer includes an organic material instead of an inorganic material, the organic light-emitting diode OLED may be deteriorated due to outgassing that occurs in the organic layer 209. In an embodiment of the present disclosure, the pixel defining layer 215 may include an inorganic material, and the pixel defining layer 215 may block or reduce a gas generated in the organic layer 209 from being provided to the emission layer 212. Accordingly, the deterioration of the organic light-emitting diode OLED, as a display element, may be prevented or reduced, and the lifespan of the display element may be increased.

In an embodiment, the organic layer 209 may include an acrylic polymer to reduce a cost of manufacturing a display device and/or the display panel 10. In this case, compared with the organic layer 209 including the PSPI, an amount of gas generated in the organic layer 209 may be greater, and the organic light-emitting diode OLED may be easily deteriorated.

In an embodiment of the present disclosure, even when the organic layer 209 includes the acrylic polymer, the pixel defining layer 215 including an inorganic material may prevent or reduce the occurrence of deterioration of the organic light-emitting diode OLED. Accordingly, the lifespan of the display element may be increased while the cost of manufacturing a display device and/or the display panel 10 may be reduced.

The second electrode 213 may be arranged on the emission layer 212. The second electrode 213 may overlap the first electrode 211 and may extend along the protrusion 209P of the organic layer 209. In an embodiment, the second electrode 213 may extend along a shape of an upper surface of the pixel defining layer 215.

At least one of the second electrode 213 and the emission layer 212 may be separated from the organic layer 209 by the pixel defining layer 215. In an embodiment, the first upper surface 209US1 of the organic layer 209 may be covered by at least one of the first electrode 211 and the pixel defining layer 215. In addition, the second upper surface 209US2 of the organic layer 209 may be covered by the pixel defining layer 215. At least one of the second electrode 213 and the emission layer 212 may be arranged on at least one of the first electrode 211 and the pixel defining layer 215. Accordingly, at least one of the second electrode 213 and the emission layer 212 may be apart from the organic layer 209 by the pixel defining layer 215, and damage to the second electrode 213 and the emission layer 212 due to the organic layer 209 may be prevented or reduced.

The second electrode 213 may include a conductive material having a low work function. For example, the second electrode 213 may include a (semi)transparent layer including Ag, Mg, Al, Pt, Pd, Au, Ni, Nd, Jr, Cr, Li, Ca, alloys thereof, or the like. Alternatively, the second electrode 213 may further include a layer such as ITO, IZO, ZnO, or $In_2O_3$ above the (semi)transparent layer including the above-stated material.

In some embodiments, a capping layer (not shown) may be further arranged on the second electrode 213. The capping layer may include lithium fluoride (LiF), an inorganic material, or/and an organic material. In addition, in an embodiment, an encapsulation layer, a touch screen layer, an optical functional layer, or the like may be arranged on the second electrode 213.

At least one of the buffer layer 201, the first gate insulating layer 203, the second gate insulating layer 205, and the interlayer insulating layer 207 may be arranged in the pad area PADA of the substrate 100. In addition, the pad PAD may be arranged in the pad area PADA. The pad PAD may overlap the pad area PADA.

The organic layer 209 may cover an edge of the pad PAD. The organic layer 209 may have a pad opening portion POP overlapping a central portion of the pad PAD. The pad opening portion POP may expose the central portion of the pad PAD.

In the pad area PADA, a third distance d3 from the upper surface 100US of the substrate 100 to a third upper surface 209US3 of the organic layer 209 may be less than the first distance d1. The third distance d3 may be a distance in the z-direction from the upper surface 100US of the substrate 100 to the third upper surface 209US3 of the organic layer 209. That is, in the pad area PADA, a third thickness t3 of the organic layer 209 may be less than the first thickness t1 of the organic layer 209. The third thickness t3 may be a distance in the z-direction from the upper surface of the interlayer insulating layer 207 to the third upper surface 209US3 of the organic layer 209.

In the present embodiment, the central portion of the pad PAD may be exposed by the pad opening portion POP. The central portion of the pad PAD may be electrically connected to the printed circuit board or the driver IC. In an embodiment, the pad PAD may be electrically connected to the printed circuit board or the driver IC through an anisotropic conductive film. When the third thickness t3 is substantially the same or greater than the first thickness t1, the pad PAD may not be electrically connected to the printed circuit board or the driver IC through the anisotropic conductive film. In the present embodiment, because the third thickness t3 is less than the first thickness t1, the pad PAD may be electrically connected to the printed circuit board or the driver IC through the anisotropic conductive film.

Figure 6:
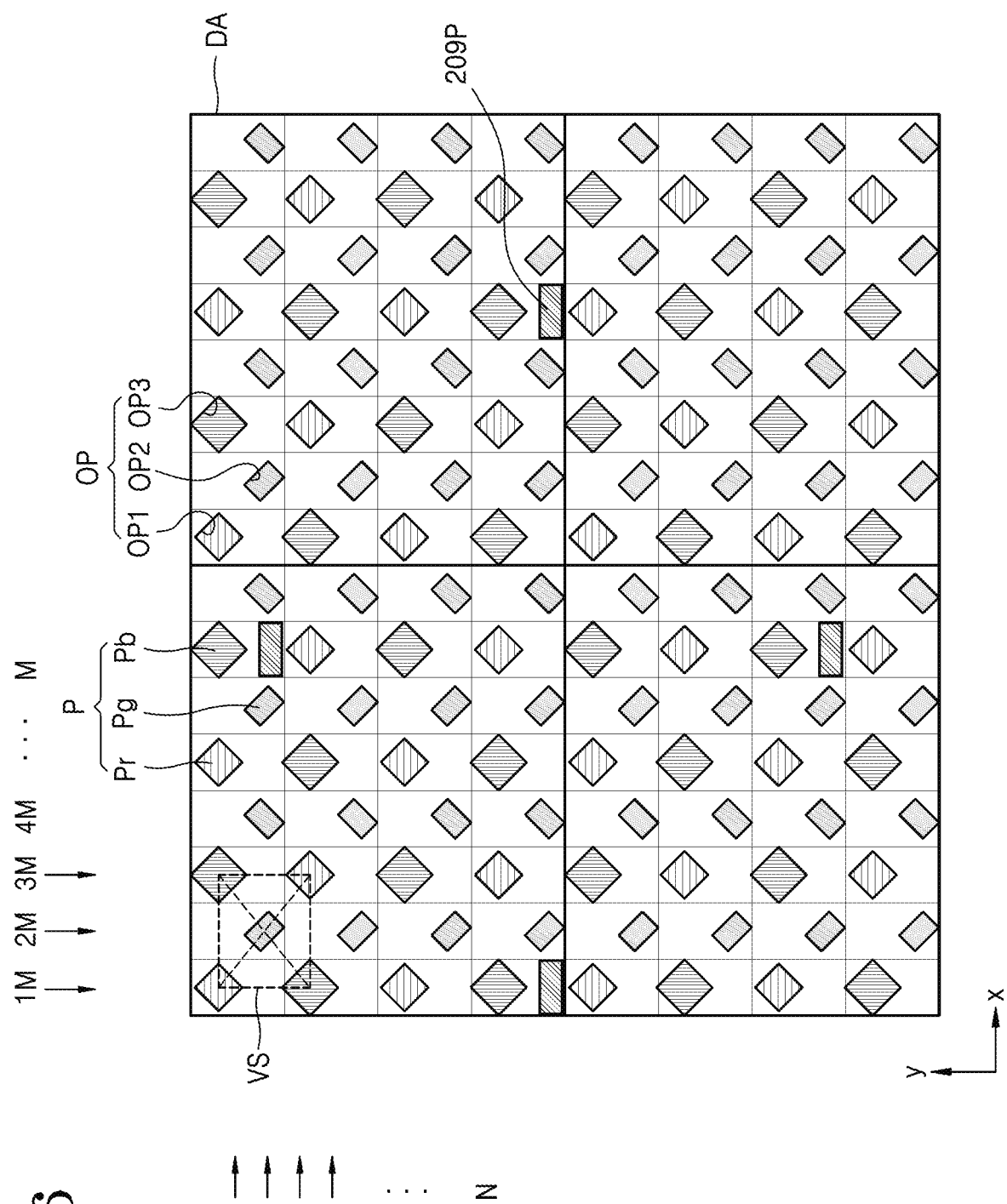
FIG. 6 is a schematic layout diagram of an arrangement structure of sub-pixels in a display area according to an embodiment.

FIG. 6 is a schematic layout diagram of an arrangement structure of the sub-pixels P in the display area DA according to an embodiment.

Referring to FIG. 6, the plurality of sub-pixels P arranged in a PENTILE® structure may be arranged in the display area DA. Each of the plurality of sub-pixels P may include a red sub-pixel Pr, a green sub-pixel Pg, and a blue sub-pixel Pb. A size of the sub-pixel P may be defined by an opening portion OP of a pixel defining layer. For example, a plurality of opening portions OP may be arranged in the display area DA. The plurality of opening portions OP may include a first opening portion OP1, a second opening portion OP2, and a third opening portion OP3. A size of the red sub-pixel Pr may be defined by a size of the first opening portion OP1. A size of the green sub-pixel Pg may be defined by a size of the second opening portion OP2. A size of the blue sub-pixel Pb may be defined by a size of the third opening portion OP3.

A plurality of red sub-pixels Pr and a plurality of blue sub-pixels Pb are alternately arranged in a first row 1N, a plurality of green sub-pixels Pg are arranged to be apart from each other at a certain distance in an adjacent second row 2N, the plurality of blue sub-pixels Pb and the plurality of red sub-pixels Pr are alternately arranged in an adjacent third row 3N, the plurality of green sub-pixels Pg are arranged to be apart from each other at a certain distance in an adjacent fourth row 4N, and such an arrangement of the sub-pixels P is repeated up to an Nth row. At this time, the size of the blue sub-pixel Pb and the red sub-pixel Pr may be greater than that of the green sub-pixel Pg.

The plurality of red sub-pixels Pr and the plurality of blue sub-pixels Pb arranged in the first row 1N and the plurality of green sub-pixels Pg arranged in the second row 2N may be arranged to alternate with each other. Accordingly, the plurality of red sub-pixels Pr and the plurality of blue sub-pixels Pb are alternately arranged in a first column 1M, the plurality of green sub-pixels Pg are arranged to be apart from each other at a certain distance in an adjacent second column 2M, the plurality of blue sub-pixels Pb and the plurality of red sub-pixels Pr are alternately arranged in an adjacent third column 3M, the plurality of green sub-pixels Pg are arranged to be apart from each other at a certain distance in an adjacent fourth column 4M, and such an arrangement of the sub-pixels P is repeated up to an Mth column.

When the arrangement structure of the sub-pixels P is expressed differently, it may be expressed that red sub-pixels Pr are arranged at first and third vertices facing each other among vertices of a virtual rectangle VS, in which a central point of the green sub-pixel Pg is a central point of a rectangle, and blue sub-pixels Pb are arranged at second and fourth vertices, which are the remaining vertices. At this time, the virtual rectangle VS may be variously changed, such as a rectangle, a rhombus, a square, or the like.

The arrangement structure of the sub-pixels P may be referred to as a PENTILE® matrix structure or a PENTILE® structure, and high resolution may be implemented with a small number of sub-pixels P by sharing adjacent sub-pixels P.

Although FIG. 6 illustrates that the sub-pixels P are in a PENTILE® matrix structure, the inventive concept is not limited thereto. For example, the plurality of sub-pixels P may be arranged in various shapes such as a stripe structure, a mosaic arrangement structure, a delta arrangement structure, or the like.

A plurality of protrusions 209P of the organic layer 209 may be arranged in the display area DA. The plurality of protrusions 209P may be apart from each other. In an embodiment, a plurality of opening portions OP may be arranged between the plurality of protrusions 209P, which are adjacent to each other. For example, the plurality of protrusions 209P may be apart from each other in an x-direction of FIG. 6, and a plurality of second opening portions OP2 may be arranged between the plurality of protrusions 209P, which are adjacent to each other in the x-direction. As another example, the plurality of protrusions 209P may be apart from each other in a y-direction of FIG. 6. A plurality of first opening portions OP1 and a plurality of third opening portions OP3 may be arranged between the plurality of protrusions 209P, which are adjacent to each other in the y-direction. Accordingly, according to the arrangement structure of the sub-pixels P, the plurality of protrusions 209P may be efficiently arranged between the plurality of opening portions OP, which are adjacent to each other.

Figure 7:
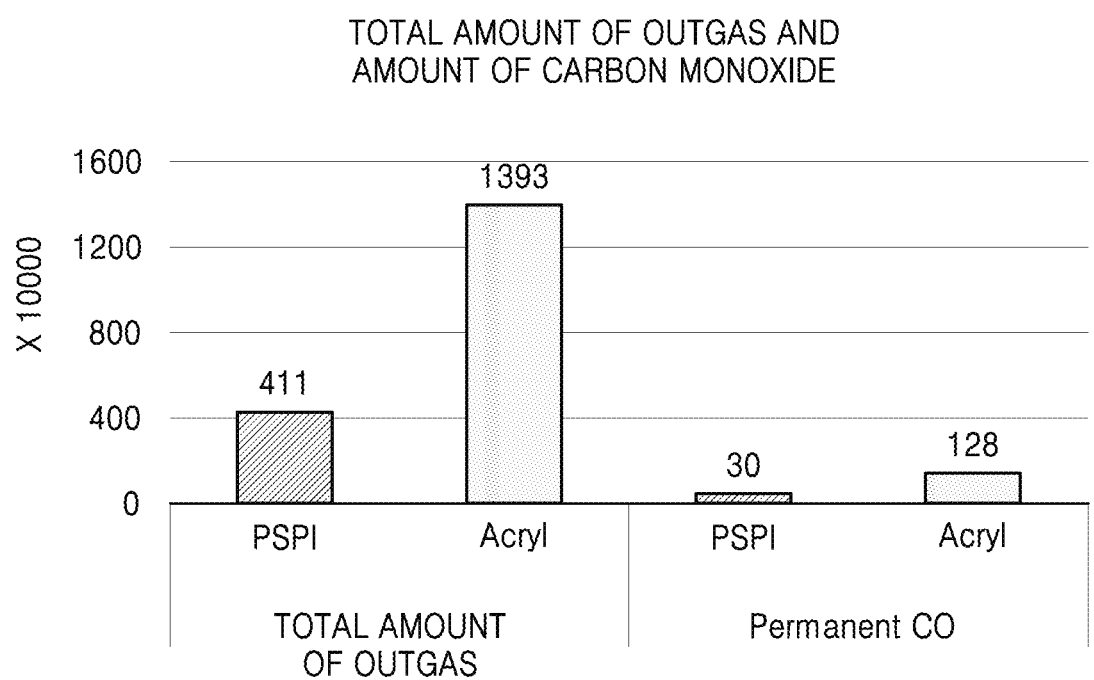
FIG. 7 is a graph showing a total amount of outgas and an amount of carbon monoxide according to a material of an organic layer.

FIG. 7 is a graph showing a total amount of outgas and an amount of carbon monoxide according to a material of an organic layer. FIG. 7 shows a graph relatively comparing the total amount of outgas and the amount of carbon monoxide respectively generated when PSPI is used as a material of an organic layer and when an acrylic polymer is used as a material of an organic layer.

Referring to FIG. 7, the total amount of outgas increases by about 3.4 times when an acrylic polymer is used as a material of an organic layer than when PSPI is used as a material of an organic layer. In addition, the amount of carbon monoxide increases by about 4.3 times when an acrylic polymer is used as a material of an organic layer than when PSPI is used as a material of an organic layer. That is, when an acrylic polymer is used as a material of an organic layer, a cost of manufacturing a display panel and/or a display device may be reduced, but the total amount of outgas may increase.

Figure 8A:
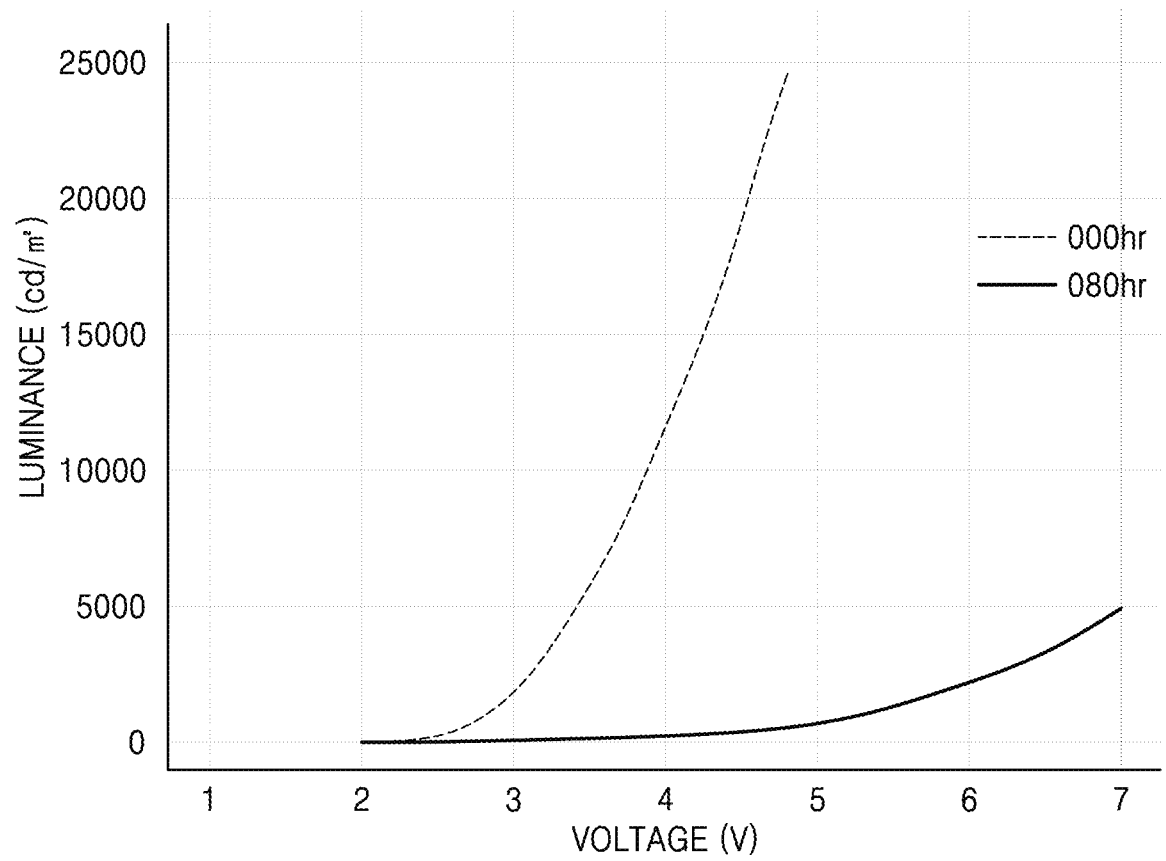
FIG. 8A is a graph showing a voltage-luminance result of a display element according to a comparative embodiment over time.
Figure 8B:
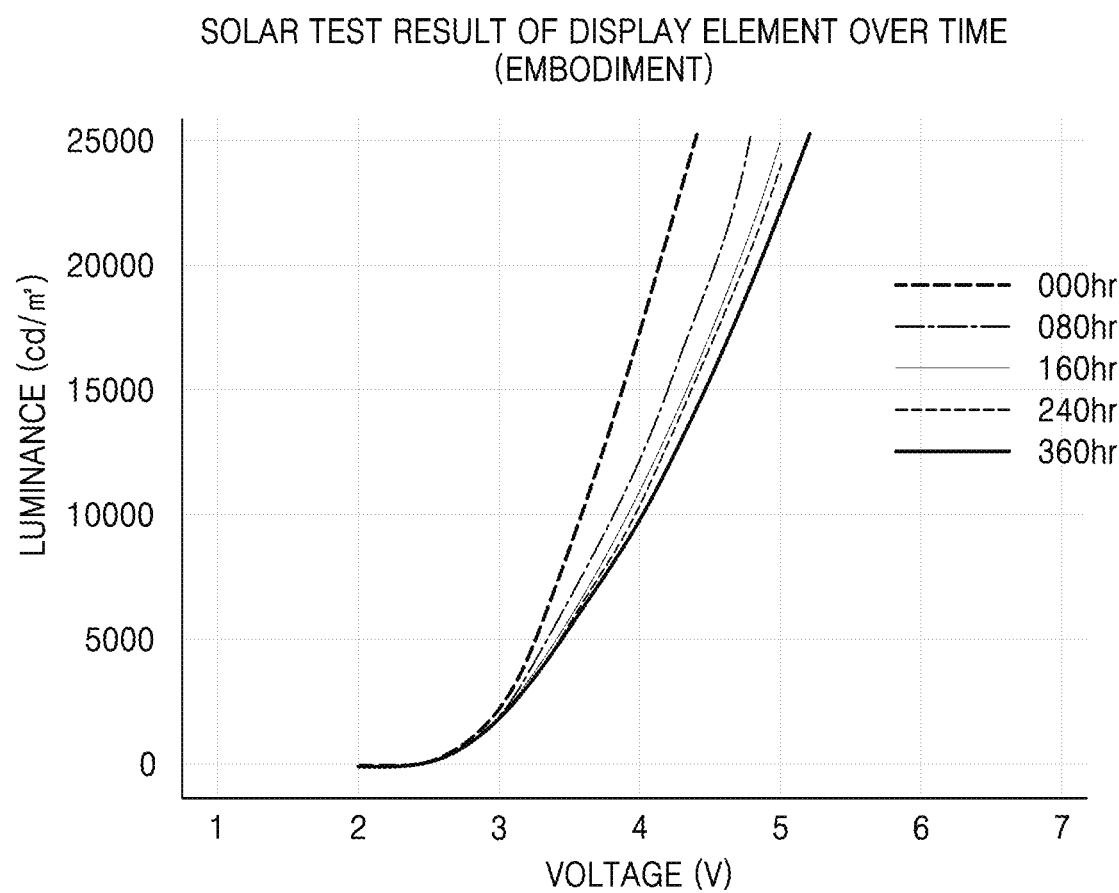
FIG. 8B is a graph showing a voltage-luminance result of a display element according to an embodiment over time.

FIG. 8A is a graph showing a voltage-luminance result of a display element according to a comparative embodiment over time. FIG. 8B is a graph showing a voltage-luminance result of a display element according to an embodiment over time. FIG. 8C is a table showing a solar test according to conditions. In the comparative embodiment, a pixel defining layer may include PSPI, and in the embodiment of the present disclosure, the pixel defining layer may include an inorganic material.

Referring to FIG. 8A, in the comparative embodiment in which the pixel defining layer includes the PSPI, it may be seen that a luminance value is lower than an initial value at the same voltage after 80 hours, which is the period of a solar test, have passed.

Referring to FIG. 8B, in the embodiment of the present disclosure in which the pixel defining layer includes the inorganic material, it may be seen that a luminance value is maintained similar to the initial value at the same voltage even when the solar test continues. Accordingly, when the pixel defining layer includes the inorganic material, the lifespan of a display element is longer than when the pixel defining layer includes an organic material.

Referring to FIG. 8C, in the case of a luminance ratio, it may be stated that reliability of a display device or a display panel is high when a difference between result values before and after a solar test is less than 10%. In the case of a color temperature difference, it may be stated that reliability of a display device or a display panel is high when a difference between result values before and after a solar test is 400 K or less.

A condition X is a case where an organic layer includes PSPI and a pixel defining layer includes an organic material. A condition Y is a case where an organic layer includes an acrylic polymer and a pixel defining layer includes an organic material. A condition Z is a case where an organic layer includes PSPI and a pixel defining layer includes an inorganic material. A condition W is a case where an organic layer includes an acrylic polymer and a pixel defining layer includes an inorganic material.

Under the condition X, the organic layer includes the PSPI, and thus, an amount of outgas generated may be relatively small. Under the condition X, even when the pixel defining layer includes the organic material, an organic light-emitting diode hardly deteriorates. Under the condition X, an average luminance ratio is 101.1%, and a minimum value is 100.0%. In addition, an average color temperature difference is 125 K, and a maximum value is 254 K. Accordingly, it may be stated that the reliability of a display device or a display panel is high.

Under the condition Y, the organic layer includes the acrylic polymer, and thus, the amount of outgas generated may be relatively high. Under the condition Y, because the pixel defining layer includes the organic material, the outgas may deteriorate the organic light-emitting diode through the pixel defining layer. Under the condition Y, the average luminance ratio is 93.0%, and the minimum value is 72.1%. In addition, the average color temperature difference is 459 K, and the maximum value is 1299 K. Accordingly, it may be stated that the reliability of a display device or a display panel is low.

Under the condition Z, the organic layer includes the PSPI, and thus, an amount of outgas generated may be relatively small. Under the condition Z, because the pixel defining layer includes the inorganic material, even when outgas is generated in the organic layer, the outgas may be blocked from reaching the organic light-emitting diode through the pixel defining layer. Under the condition Z, the average luminance ratio is 98.6%, and the minimum value is 93.7%. In addition, the average color temperature difference is 108 K, and the maximum value is 179 K. Accordingly, it may be stated that the reliability of a display device or a display panel is high.

Under the condition W, the organic layer includes the acrylic polymer, and thus, the amount of outgas generated may be relatively high. However, under the condition W, because the pixel defining layer includes the inorganic material, even when outgas is generated, the outgas may be blocked from reaching the organic light-emitting diode through the pixel defining layer. Under the condition W, the average luminance ratio is 99.9%, and the minimum value is 99.6%. In addition, the average color temperature difference is 71 K, and the maximum value is 164 K. Accordingly, it may be stated that the reliability of a display device or a display panel is high.

Therefore, when a pixel defining layer includes an inorganic material as in the embodiment of the present disclosure, reliability of a display device and/or a display panel may be improved. In addition, when the organic layer includes an acrylic polymer, a cost of manufacturing the display device and/or the display panel may be reduced.

Figure 15A:
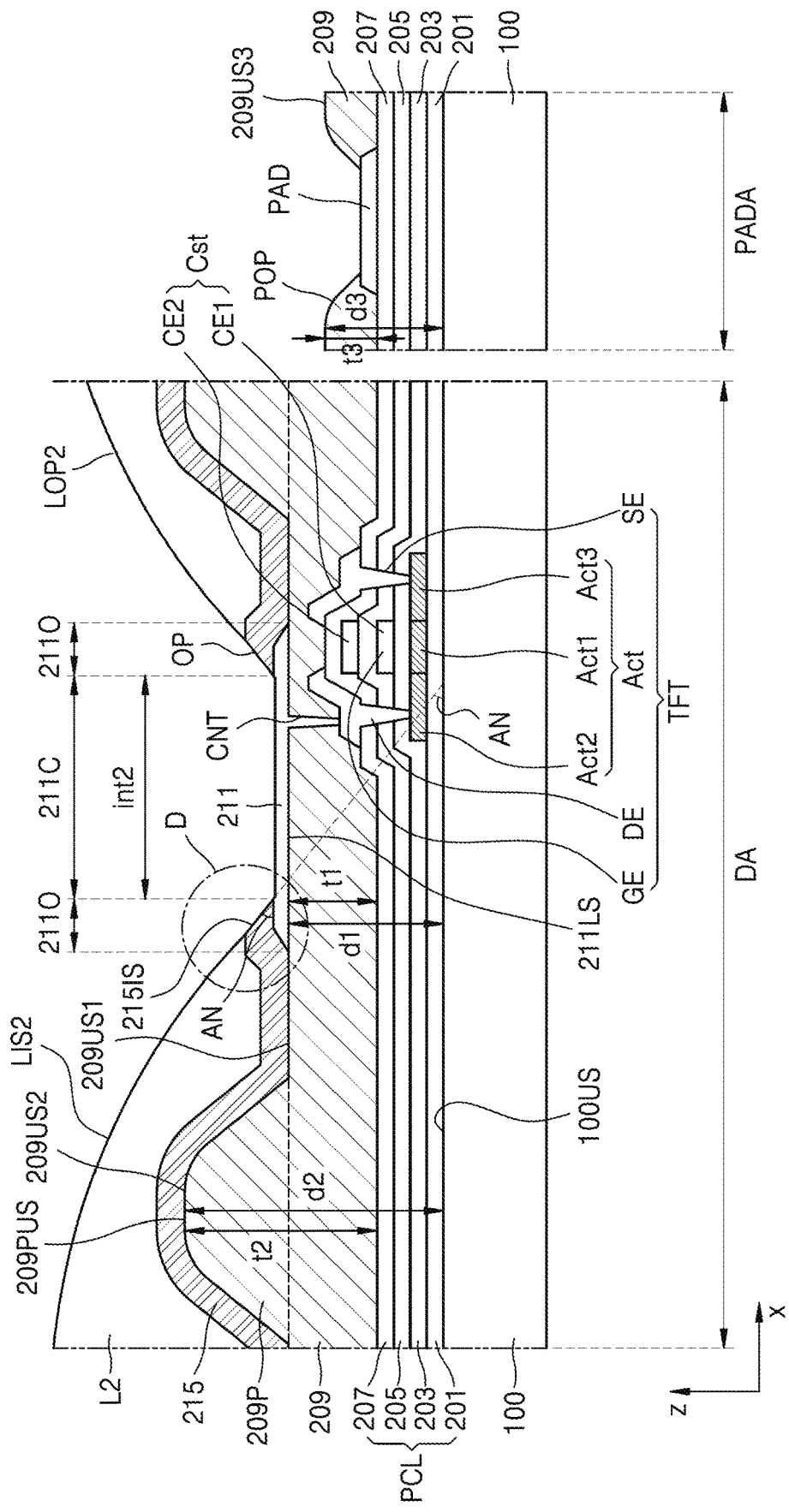
FIG. 15A is a schematic cross-sectional view illustrating a method of manufacturing a display device, according to an embodiment.
Figure 15B:
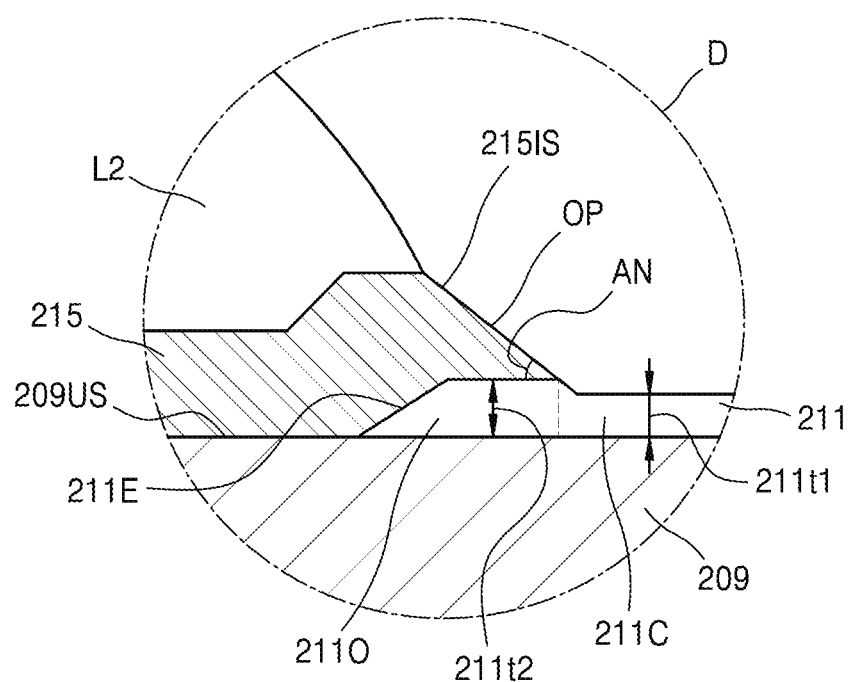
FIG. 15B is an enlarged view of an area D of FIG. 15A.
Figure 16:
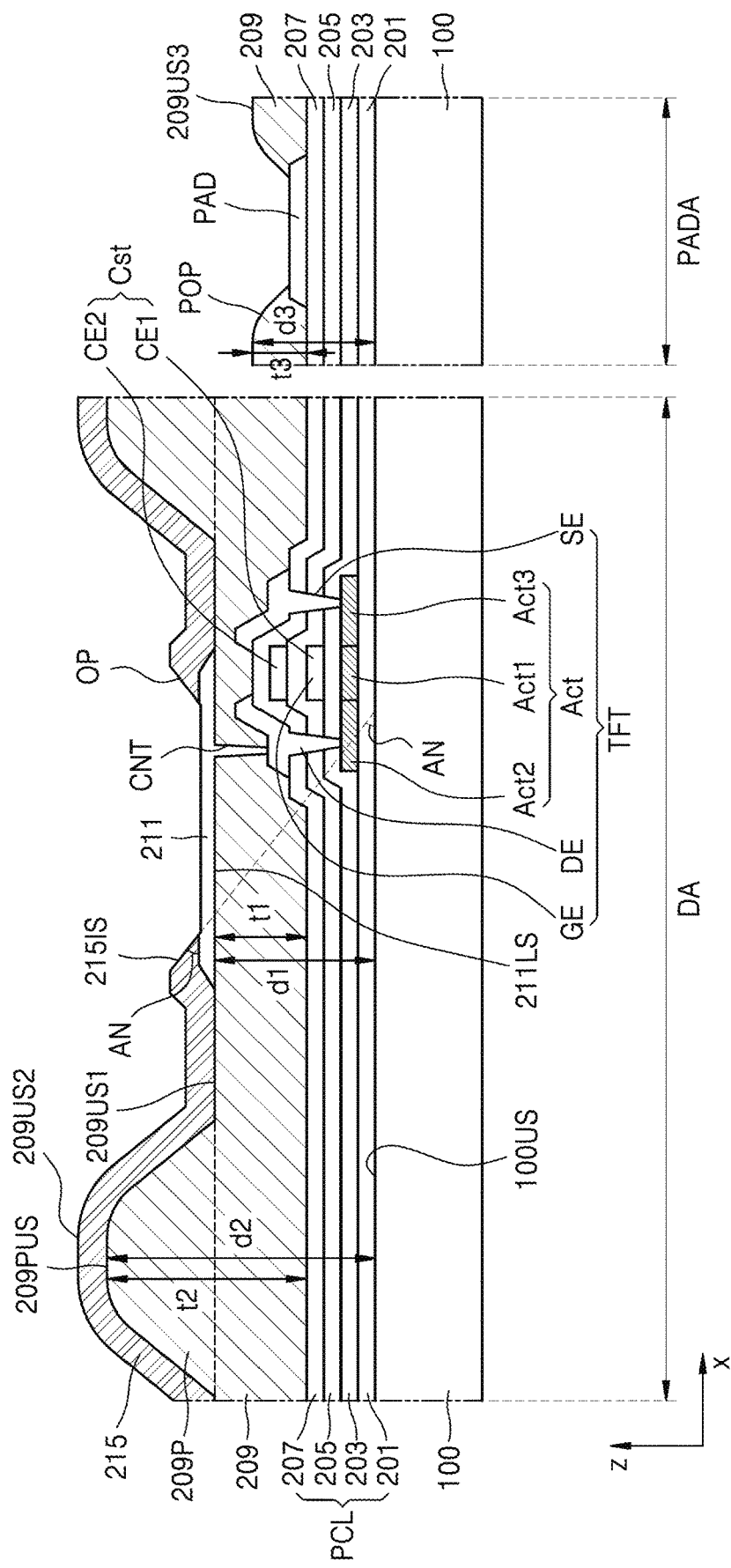
FIGS. 16 and 17 are schematic cross-sectional views illustrating a method of manufacturing a display device, according to an embodiment.
Figure 17:
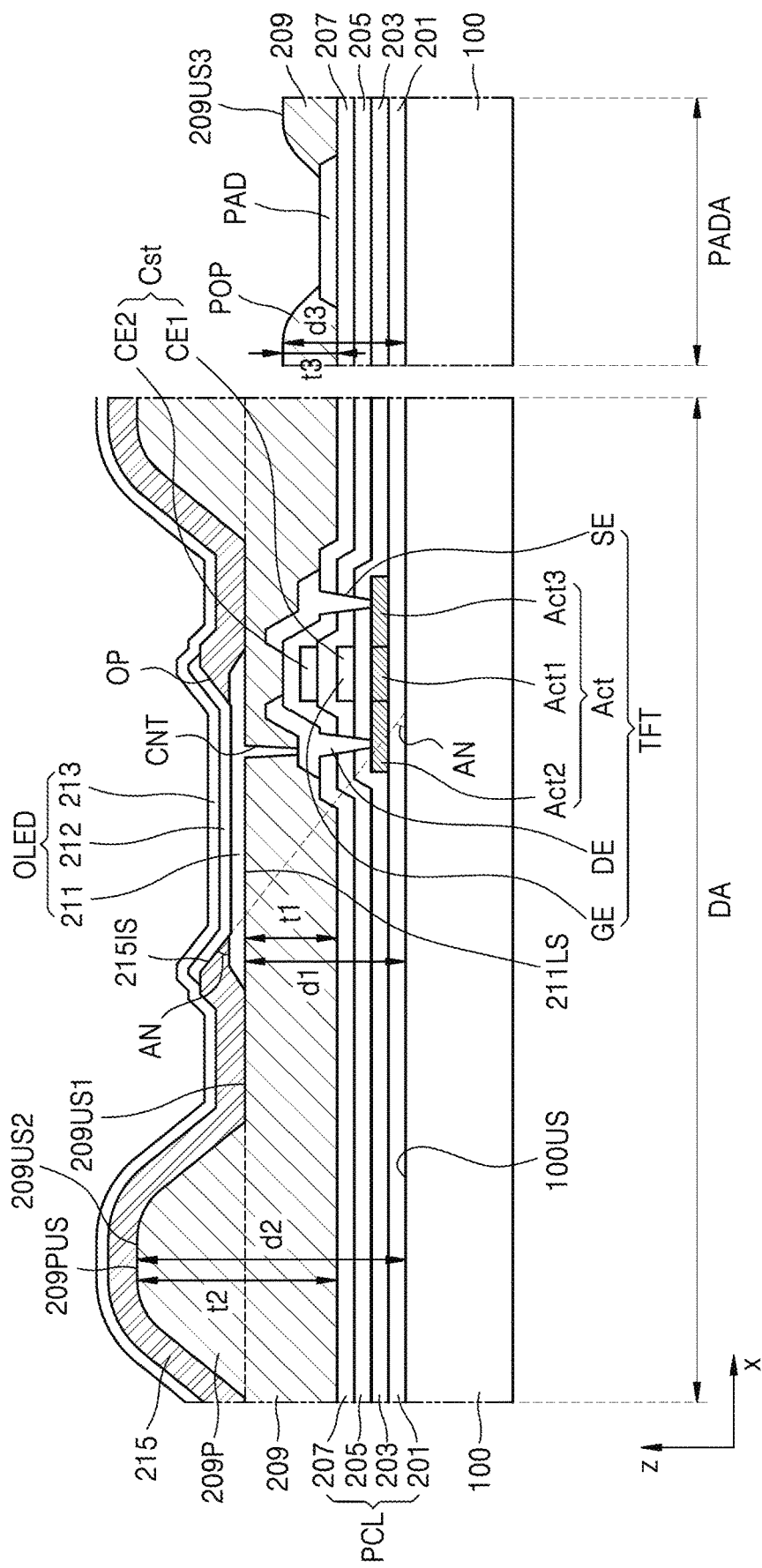

FIGS. 9 to 14 are schematic cross-sectional views illustrating a method of manufacturing a display device, according to an embodiment. FIG. 15A is a schematic cross-sectional view illustrating a method of manufacturing a display device, according to an embodiment. FIG. 15B is an enlarged view of an area D of FIG. 15A. FIGS. 16 and 17 are schematic cross-sectional views illustrating a method of manufacturing a display device, according to an embodiment.

Figure 9:
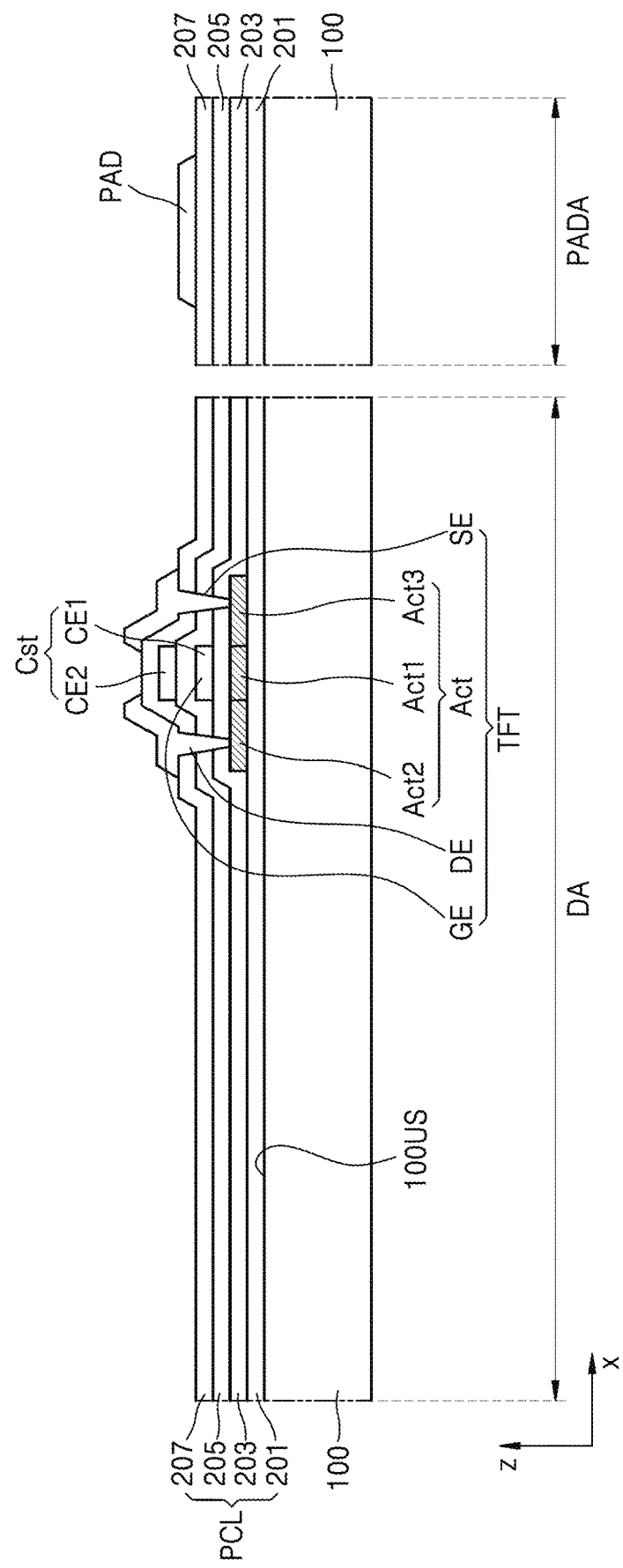
FIGS. 9, 10, 11, 12, 13, and 14 are schematic cross-sectional views illustrating a method of manufacturing a display device, according to an embodiment.

Referring to FIG. 9, the substrate 100 may include the display area DA and the pad area PADA. The pixel circuit layer PCL may be formed in the display area DA. The pixel circuit layer PCL may include the first gate insulating layer 203, the second gate insulating layer 205, the interlayer insulating layer 207, at least one thin-film transistor TFT, and the storage capacitor Cst. The at least one thin-film transistor TFT may include the semiconductor layer Act, the gate electrode GE, the source electrode SE, and the drain electrode DE. The storage capacitor Cst may include the lower electrode CE1 and the upper electrode CE2.

The pad PAD may be formed in the pad area PADA. In an embodiment, the pad PAD may be formed on the interlayer insulating layer 207.

Figure 10:
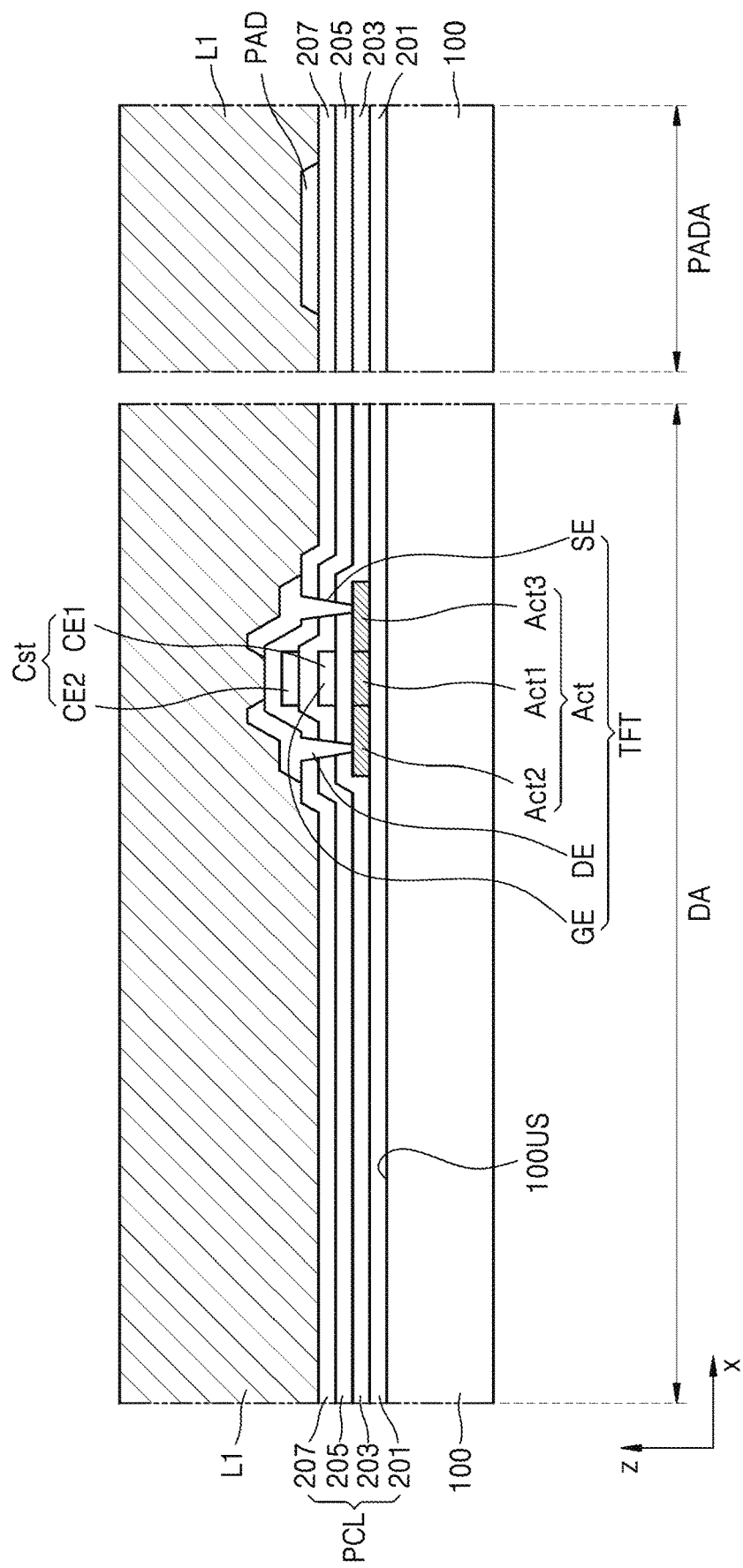
Figure 11:
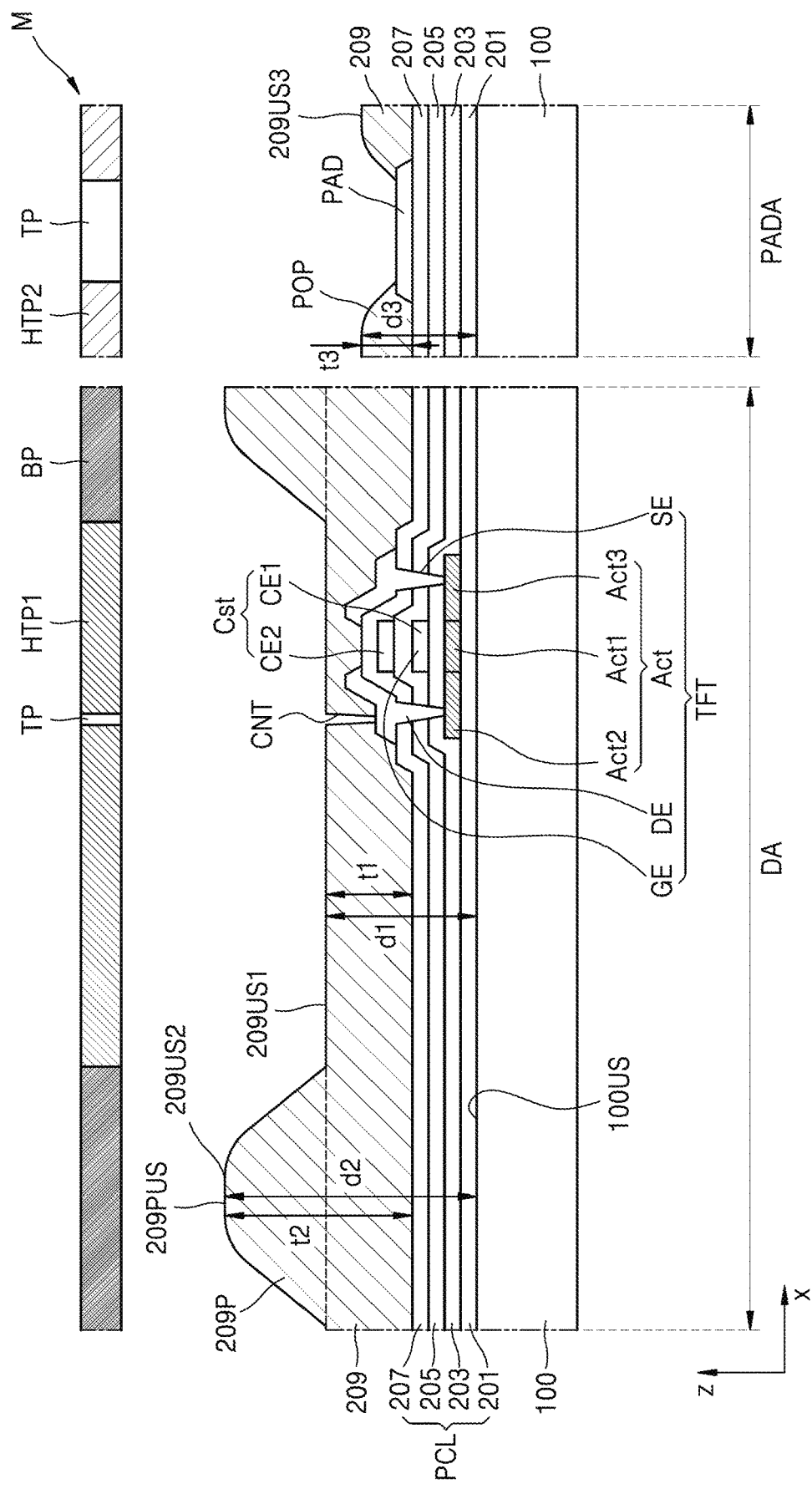

Referring to FIGS. 10 and 11, the organic layer 209 having the protrusion 209P protruding in the thickness direction of the substrate 100 and overlapping the display area DA may be formed on the substrate 100.

First, a first layer L1 including an organic material may be formed above the substrate 100. The first layer L1 may be formed in the display area DA and the pad area PADA. In an embodiment, the first layer L1 may be formed on the pixel circuit layer PCL. The first layer L1 may be formed by coating in various methods such as spin coating, slit-coating, spraying, immersion, or the like.

The first layer L1 may include a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, and a mixture thereof. In an embodiment, the first layer L1 may include the PSPI. In an embodiment, when the first layer L1 includes the acrylic polymer, a cost of manufacturing a display device and/or a display panel may be reduced.

Next, a mask M may be arranged on the first layer L1. The mask M may be arranged to overlap the display area DA and the pad area PADA. The mask M may include a transparent portion TP, a light-blocking portion BP, a first semi-transparent portion HTP1, and a second semi-transparent portion HTP2. The transparent portion TP may allow most of light to pass through. The first semi-transparent portion HTP1 and the second semi-transparent portion HTP2 may allow some light to pass through. In an embodiment, the light transmittances of the first semi-transparent portion HTP1 and the second semi-transparent portion HTP2 may be greater than the light transmittance of the light-blocking portion BP. The light transmittances of the first semi-transparent portion HTP1 and the second semi-transparent portion HTP2 may be less than the light transmittance of the transparent portion TP. In an embodiment, the second semi-transparent portion HTP2 may allow more light to pass through than the first semi-transparent portion HTP1. The light transmittance of the second semi-transparent portion HTP2 may be greater than the light transmittance of the first semi-transparent portion HTP1. The light-blocking portion BP may shield most of the light. The light transmittance of the light-blocking portion BP may be less than that of the first semi-transparent portion HTP1, the second semi-transparent portion HTP2, and the transparent portion TP.

In an embodiment, the transparent portion TP, the first semi-transparent portion HTP1, and the light-blocking portion BP may overlap the display area DA. In an embodiment, the transparent portion TP and the second semi-transparent portion HTP2 may overlap the pad area PADA.

Next, the first layer L1 may be exposed to light. In addition, a portion of the first layer L1 may be removed through a development operation, and the organic layer 209 having the protrusion 209P may be formed.

The contact hole CNT of the organic layer 209 may be formed to overlap the transparent portion TP in the display area DA. The contact hole CNT of the organic layer 209 may expose at least a portion of the at least one thin-film transistor TFT. For example, the contact hole CNT of the organic layer 209 may expose the source electrode SE or the drain electrode DE.

In the display area DA, the first upper surface 209US1 of the organic layer 209, the first upper surface 209US1 overlapping the first semi-transparent portion HTP1, may be formed flat.

In the display area DA, the protrusion 209P may be formed in the organic layer 209 overlapping the light-blocking portion BP. The first distance d1 from the upper surface 100US of the substrate 100 to the first upper surface 209US1 of the organic layer 209 may be less than the second distance d2 from the upper surface 100US of the substrate 100 to the upper surface 209PUS of the protrusion 209P. The upper surface 209PUS of the protrusion 209P may be the second upper surface 209US2 of the organic layer 209 in the protrusion 209P. In an embodiment, the first thickness t1 of the organic layer 209 overlapping the first semi-transparent portion HTP1 may be less than the second thickness t2 of the organic layer 209 in the protrusion 209P. Accordingly, the protrusion 209P may function as a spacer.

The pad opening portion POP of the organic layer 209 may be formed to overlap the transparent portion TP in the pad area PADA. The pad opening portion POP of the organic layer 209 may expose at least a portion of the pad PAD. For example, the organic layer 209 may cover the edge of the pad PAD. The pad opening portion POP of the organic layer 209 may expose the central portion of the pad PAD.

In the pad area PADA, the third upper surface 209US3 of the organic layer 209, the third upper surface 209US3 overlapping the second semi-transparent portion HTP2, may be flat. In the pad area PADA, the third distance d3 from the upper surface 100US of the substrate 100 to the third upper surface 209US3 of the organic layer 209 may be less than the first distance d1. That is, in the pad area PADA, the third thickness t3 of the organic layer 209 may be less than the first thickness t1 of the organic layer 209.

In the present embodiment, the mask M may include the transparent portion TP, the first semi-transparent portion HTP1, the second semi-transparent portion HTP2, and the light-blocking portion BP. Accordingly, the embodiment of the present embodiment may adjust the thickness of the organic layer 209 through one operation. For example, in the display area DA, the organic layer 209 may have the protrusion 209P having the second thickness t2. The protrusion 209P may function as a spacer. The third thickness t3 of the organic layer 209 in the pad area PADA may be less than the first thickness t1 of the organic layer 209 in the display area DA. Accordingly, the pad PAD may be electrically connected to the printed circuit board or the driver IC through the anisotropic conductive film.

Figure 12:
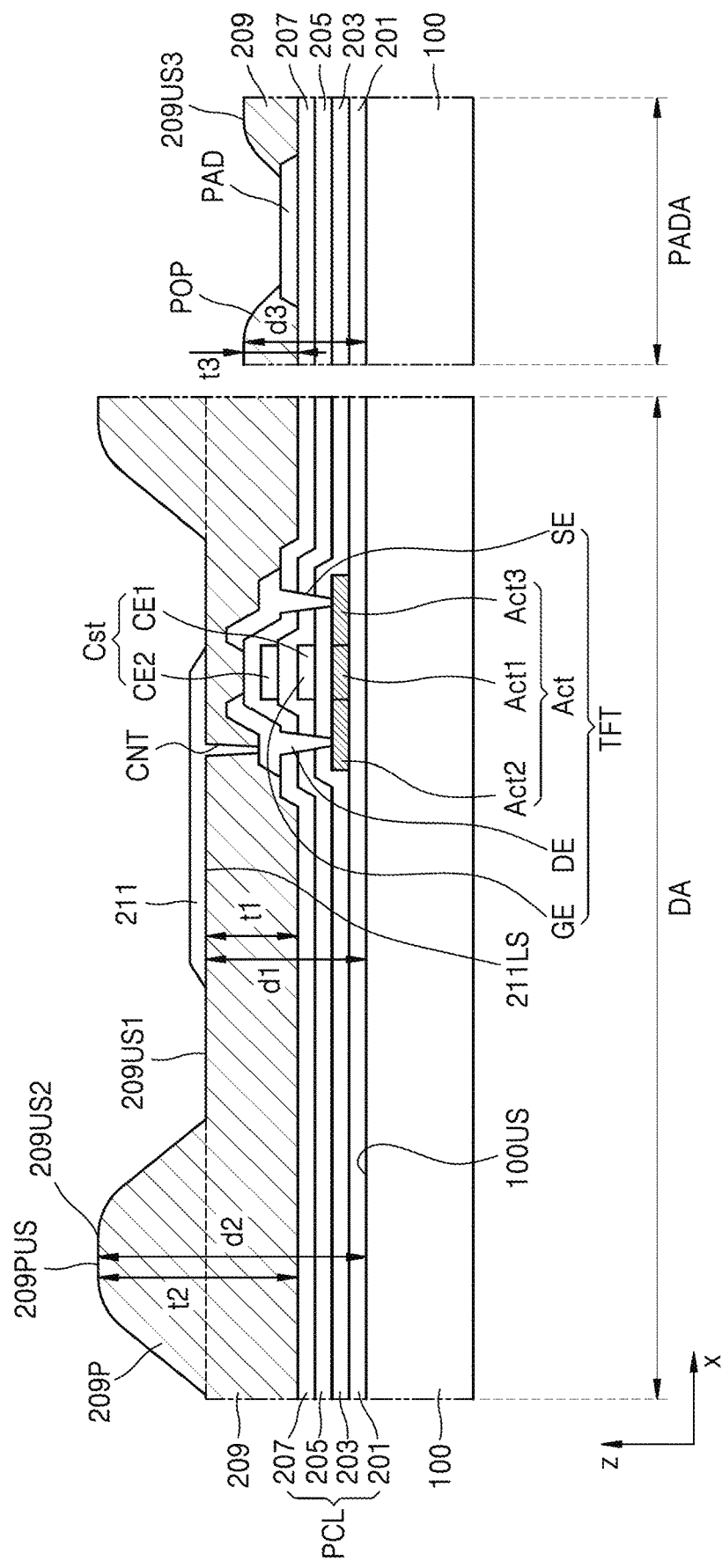

Referring to FIG. 12, the first electrode 211 may be formed on the organic layer 209 to overlap the display area DA. The first electrode 211 may be electrically connected to the at least one thin-film transistor TFT through the contact hole CNT of the organic layer 209. The first electrode 211 may be formed by entirely forming a conductive pattern on the organic layer 209 and then patterning the conductive pattern.

The first distance d1 from the upper surface 100US of the substrate 100 to the lower surface 211LS of the first electrode 211 may be less than the second distance d2 from the upper surface 100US of the substrate 100 to the upper surface 209PUS of the protrusion 209P, the lower surface 211LS facing the upper surface 100US of the substrate 100. In an embodiment, the first thickness t1 of the organic layer 209 on which the first electrode 211 is arranged may be less than the second thickness t2 of the organic layer 209 in the protrusion 209P. The first thickness t1 may be an average distance from the upper surface of the interlayer insulating layer 207 to the first upper surface 209US1 of the organic layer 209. The second thickness t2 may be a maximum distance from the upper surface of the interlayer insulating layer 207 to the second upper surface 209US2 of the organic layer 209.

In an embodiment, the first electrode 211 may be formed after the organic layer 209 is formed. Accordingly, the first electrode 211 may be formed on the first upper surface 209US1 of the organic layer 209. In an embodiment, the first electrode 211 may be arranged between the plurality of protrusions 209P.

Figure 13:
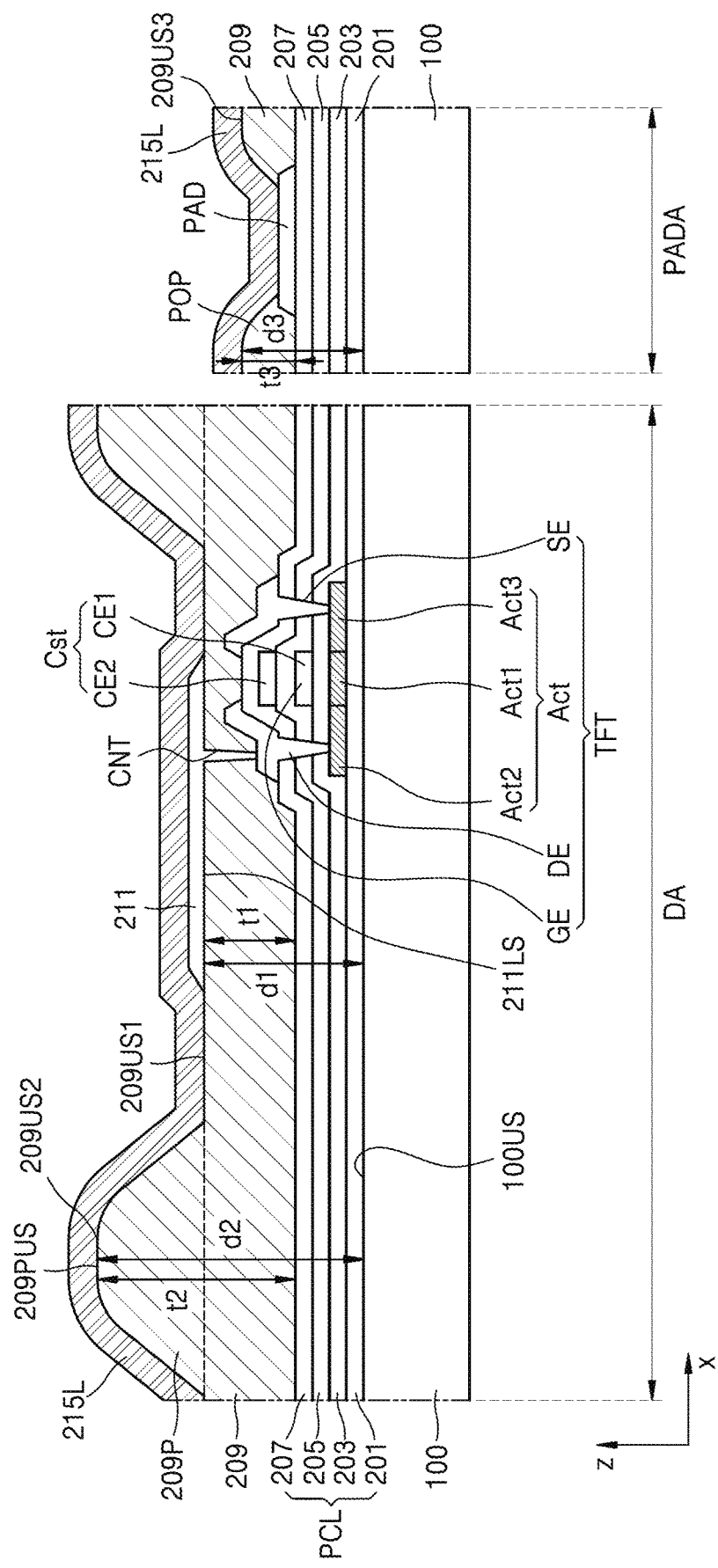

Referring to FIG. 13, an inorganic layer 215L may be formed. In an embodiment, the inorganic layer 215L may be formed on the first electrode 211 and the organic layer 209. The inorganic layer 215L may be entirely formed on the first electrode 211 and the organic layer 209. The inorganic layer 215L may cover the first electrode 211 and the organic layer 209. The inorganic layer 215L may entirely cover the first electrode 211 and the organic layer 209. In an embodiment, a shape of the inorganic layer 215L may be set according to shapes of the upper surface of the first electrode 211 and an upper surface of the organic layer 209.

In an embodiment, the inorganic layer 215L may be formed in the pad area PADA. The inorganic layer 215L may be formed to cover the pad PAD and the organic layer 209 in the pad area PADA. In another embodiment, the inorganic layer 215L may not be formed in the pad area PADA. Hereinafter, a case where the inorganic layer 215L is formed in the pad area PADA will be mainly described in detail.

In an embodiment, the inorganic layer 215L may be formed by chemical vapor deposition (CVD). In another embodiment, the inorganic layer 215L may be formed by plasma-enhanced chemical vapor deposition (PECVD). In another embodiment, the inorganic layer 215L may be formed by physical vapor deposition (PVD). For example, the inorganic layer 215L may be formed by a sputtering method or an evaporation method. In another embodiment, the inorganic layer 215L may be formed by atomic layer deposition. In an embodiment, the inorganic layer 215L may be formed at 280° C. or less.

The inorganic layer 215L may include an inorganic material. The inorganic layer 215L may include an inorganic insulating material such as silicon nitride ($SiN_x$), silicon oxynitride (SiON), and silicon oxide ($SiO_2$), and may be a single layer or a multi-layer, each including the above-stated inorganic insulating material.

Figure 14:
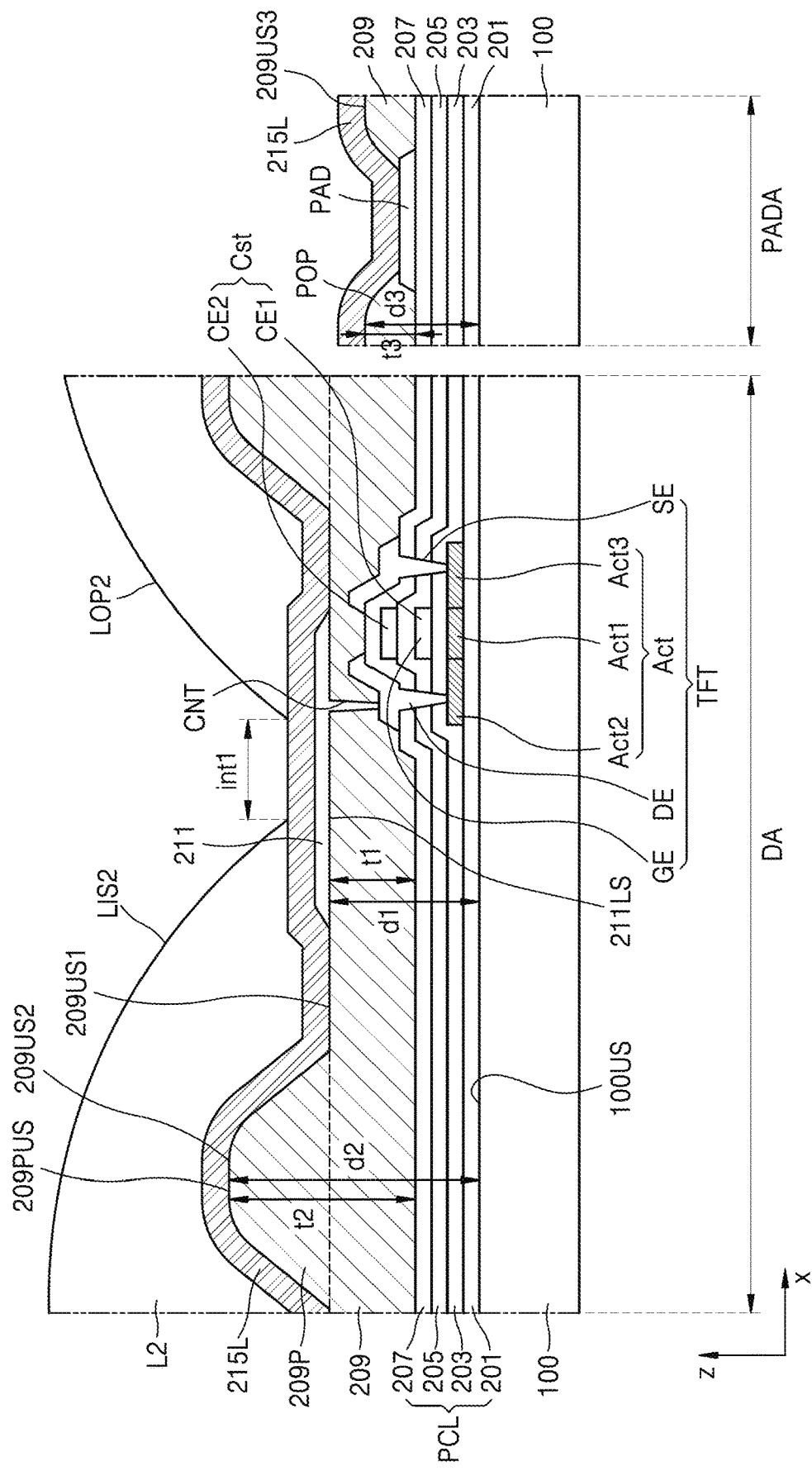

Referring to FIG. 14, a second layer L2 having a second layer opening portion LOP2 may be formed on the inorganic layer 215L. The second layer L2 having the second layer opening portion LOP2 may be formed similarly to the organic layer 209. In an embodiment, the second layer L2 may include a positive photoresist. A light-exposed area of the positive photoresist may be etched in a subsequent development operation. In an embodiment, the second layer L2 may include a negative photoresist. The negative photoresist has a characteristic that the rest of areas except a light-exposed area thereof is etched.

The second layer L2 may be formed by coating a photoresist solution (not shown) on the inorganic layer 215L by various methods such as spin coating, slit-coating, spraying, immersion, or the like.

Next, the second layer opening portion LOP2 may be formed in the second layer L2 through an exposure operation and a development operation. The second layer opening portion LOP2 may expose the inorganic layer 215L. The second layer opening portion LOP2 may be defined by inner side surface LIS2 of the second layer L2. A width of the second layer opening portion LOP2 may be defined as a minimum distance between a portion of the inner side surface LIS2 of the second layer L2 and the other portion of the inner side surface LIS2 of the second layer L2, the portion of the inner side surface LIS2 and the other portion of the inner side surface LIS2 facing each other. In an embodiment, the portion of the inner side surface LIS2 of the second layer L2 and the other portion of the inner side surface LIS2 of the second layer L2 may be apart from each other by a first interval int1.

Referring to FIGS. 14, 15A, and 15B, the pixel defining layer 215 may be formed. In an embodiment, the opening portion OP of the pixel defining layer 215 may be formed by etching the inorganic layer 215L exposed to the second layer opening portion LOP2. In an embodiment, the inorganic layer 215L may be dry-etched.

The opening portion OP of the pixel defining layer 215 may be defined by the inner side surface 215IS of the pixel defining layer 215. The opening portion OP of the pixel defining layer 215 may expose the central portion 211C of the first electrode 211. In an embodiment, a width of the opening portion OP may correspond to a width of an emission area. In an embodiment, the width of the opening portion OP may define the size of a sub-pixel. The width of the opening portion OP may be defined as a minimum distance between a portion of the inner side surface 215IS of the pixel defining layer 215 and the other portion of the inner side surface 215IS of the pixel defining layer 215, the portion of the inner side surface 215IS of the pixel defining layer 215 and the other portion of the inner side surface 215IS of the pixel defining layer 215 facing each other. In an embodiment, the portion of the inner side surface 215IS of the pixel defining layer 215 and the other portion of the inner side surface 215IS of the pixel defining layer 215 may be apart from each other by a second interval int2.

The angle AN formed by the inner side surface 215IS of the pixel defining layer 215 and the upper surface 100US of the substrate 100 may be 40 degrees or less. When the angle AN is 0 degree, the pixel defining layer 215 may not be defined. When the angle AN is greater than 40 degrees, the possibility that at least one of the emission layer 212 and the second electrode 213, which cover the pixel defining layer 215, is short-circuited may increase. In some embodiments, the angle AN may be defined as an angle between the inner side surface 215IS of the pixel defining layer 215 and the upper surface of the first electrode 211.

In an embodiment, the second interval int2 may be different from the first interval int1. For example, the second interval int2 may be greater than the first interval int1. As another example, the second interval int2 may be less than the first interval int1. In another embodiment, the second interval int2 may be substantially the same as the first interval int2.

The first electrode 211 may include the central portion 211C and the outer portion 211O. The central portion 211C of the first electrode 211 may be integrally provided with the outer portion 211O of the first electrode 211. The central portion 211C of the first electrode 211 may overlap the opening portion OP of the pixel defining layer 215. The outer portion 211O of the first electrode 211 may surround the central portion 211C of the first electrode 211. The outer portion 211O of the first electrode 211 may include the edge 211E of the first electrode 211.

When forming the pixel defining layer 215 by etching the inorganic layer 215L, at least a portion of the central portion 211C of the first electrode 211 may be etched. The central portion 211C of the first electrode 211 may be over-etched when forming the opening portion OP of the pixel defining layer 215. Accordingly, the thickness 211t1 of the central portion 211C of the first electrode 211 may be less than the thickness 211t2 of the outer portion 211O of the first electrode 211. For example, a difference between the thickness 211t1 of the central portion 211C of the first electrode 211 and the thickness 211t2 of the outer portion 211O of the first electrode 211 may be about 10 Å or less. In another embodiment, the thickness 211t1 of the central portion 211C of the first electrode 211 may be substantially the same as the thickness 211t2 of the outer portion 211O of the first electrode 211.

When etching the inorganic layer 215L, the second layer L2 may also be etched. In this case, a rate at which the second layer L2 is etched and a rate at which the inorganic layer 215L is etched may be different. For example, the rate at which the second layer L2 is etched may be greater than the rate at which the inorganic layer 215L is etched. As another example, the rate at which the second layer L2 is etched may be less than the rate at which the inorganic layer 215L is etched. In another embodiment, the rate at which the second layer L2 is etched may be substantially the same as the rate at which the inorganic layer 215L is etched.

In the display area DA, the first upper surface 209US1 of the organic layer 209 may be covered by at least one of the first electrode 211 and the pixel defining layer 215. That is, in the display area DA, at least one of the first electrode 211 and the pixel defining layer 215 may be arranged on the first upper surface 209US1 of the organic layer 209. In addition, in the display area DA, the second upper surface 209US2 of the organic layer 209 may be covered by the pixel defining layer 215. Accordingly, even when outgassing occurs inside the organic layer 209, an outgassing gas may be prevented or reduced from passing through the first upper surface 209US1 of the organic layer 209 and the second upper surface 209US2 of the organic layer 209 in the display area DA.

In an embodiment, the inorganic layer 215L arranged in the pad area PADA may be removed. The inorganic layer 215L may be dry-etched. Accordingly, the organic layer 209 and at least a portion of the pad PAD may be exposed to the outside.

Referring to FIG. 16, the second layer L2 may be removed. The second layer L2 may be removed through a development operation.

Referring to FIG. 17, the emission layer 212 may be formed. The emission layer 212 may be formed on the first electrode 211. The emission layer 212 may overlap the opening portion OP of the pixel defining layer 215. In an embodiment, the emission layer 212 may extend along the inner side surfaces 215IS of the pixel defining layer 215.

Next, the second electrode 213 may be formed on the emission layer 212. The first electrode 211, the emission layer 212, and the second electrode 213 may form the organic light-emitting diode OLED. The second electrode 213 may overlap the first electrode 211 and may extend along the protrusion 209P of the organic layer 209. The second electrode 213 may be formed on the pixel defining layer 215 on the protrusion 209P. In an embodiment, the second electrode 213 may extend along the shape of the upper surface of the pixel defining layer 215.

At least one of the second electrode 213 and the emission layer 212 may be separated from the organic layer 209 by the pixel defining layer 215. In an embodiment, the first upper surface 209US1 of the organic layer 209 may be covered by at least one of the first electrode 211 and the pixel defining layer 215. At least one of the second electrode 213 and the emission layer 212 may be arranged on at least one of the first electrode 211 and the pixel defining layer 215. In addition, the second upper surface 209US2 of the organic layer 209 may be covered by the pixel defining layer 215. The second electrode 213 may be arranged on the pixel defining layer 215 in the protrusion 209P of the organic layer 209. Accordingly, at least one of the second electrode 213 and the emission layer 212 may be apart from the organic layer 209 by the pixel defining layer 215, and damage to the second electrode 213 and the emission layer 212 due to the organic layer 209 may be prevented or reduced.

Figure 18:
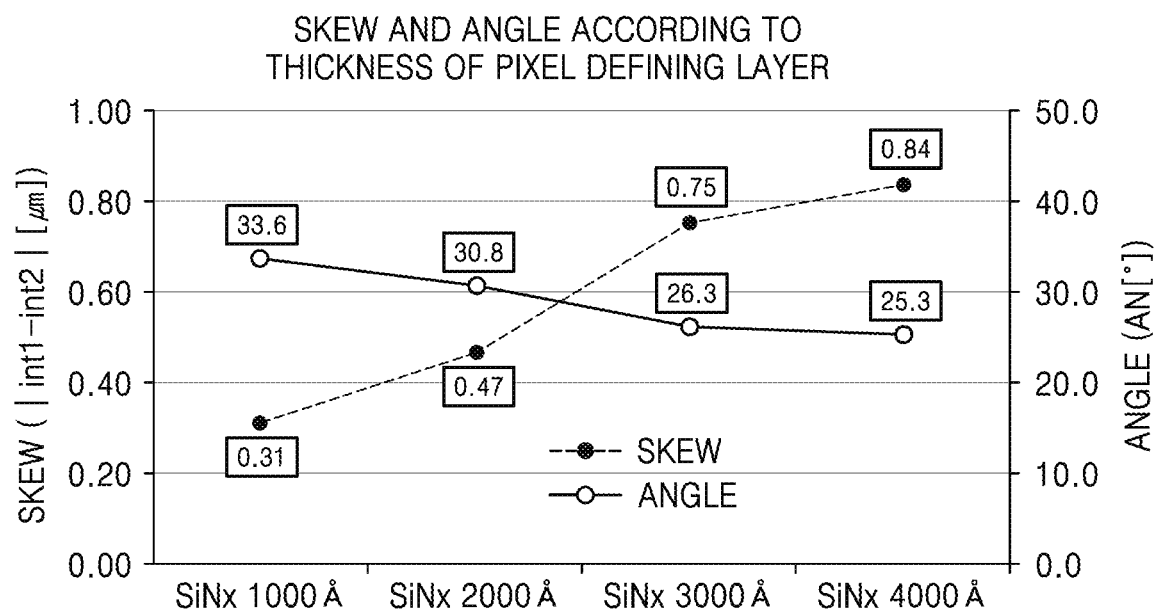
FIG. 18 is a graph showing a skew and an angle according to a thickness of a pixel defining layer.

FIG. 18 is a graph showing a skew and an angle according to a thickness of a pixel defining layer.

FIG. 18 is a graph when the pixel defining layer includes silicon nitride ($SiN_x$) as an inorganic material. A skew may be defined by a difference of the first interval int1 of FIG. 14 and a second interval int2 of FIG. 15A. That is, the skew may be defined by a difference between a width of a designed pixel defining layer and a width of an actual pixel defining layer.

As a thickness of a pixel defining layer increase, a skew increases. As the thickness of the pixel defining layer decreases, the skew decreases.

In addition, as the thickness of the pixel defining layer increases, the angle may decrease. The angle may be defined as the angle AN of FIG. 5A. Because the angle is 40 degrees or less when the thickness of pixel defining layer is 1000 Å to 4000 Å, the second electrode or the emission layer may not be short-circuited.

FIG. 19 is a table showing a skew and the angle AN according to an etch selectivity.

Referring to FIG. 19, an etching gas used when forming a pixel defining layer by dry-etching an inorganic layer may be selected by considering the etch selectivity. The etch selectivity may be defined as a ratio of an etch rate of the pixel defining layer to an etch rate of a second layer. As the etch selectivity decreases, the skew may decrease. However, as the etch selectivity decreases, the angle AN may increase. When the angle AN is greater than 40 degrees, possibility that the emission layer and the second electrode are short-circuited may increase. Accordingly, the etch selectivity may be selected to be 0.8 or more.

As described above, a display device according to an embodiment of the present disclosure may include a pixel defining layer covering a protrusion of an organic layer and an edge of a first electrode and having an opening portion overlapping a central portion of the first electrode. Because the pixel defining layer includes an inorganic material, the lifespan of a display element may increase by preventing deterioration of the display element.

In addition, a method of manufacturing a display device according to an embodiment of the present disclosure may form, on a substrate, an organic layer having a protrusion protruding in a thickness direction of the substrate and form a pixel defining layer including an inorganic material and covering the protrusion and an edge of a first electrode. Accordingly, the efficiency of an operation may be improved, and the lifespan of a display element may be increased by preventing deterioration of the display element.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
    forming, on a substrate comprising a display area and a pad area outside the display area, an organic layer having a protrusion protruding in a thickness direction of the substrate and overlapping the display area;
    forming a first electrode on the organic layer to overlap the display area;
    forming a pixel defining layer covering the protrusion and an edge of the first electrode and having an opening portion overlapping a central portion of the first electrode;
    forming an emission layer overlapping the opening portion; and
    forming a second electrode on the emission layer,
    wherein a first distance from an upper surface of the substrate to a lower surface of the first electrode is less than a second distance from the upper surface of the substrate to an upper surface of the protrusion, the lower surface of the first electrode facing the upper surface of the substrate, and
    a third distance from the upper surface of the substrate to an upper surface of the organic layer in the pad area is less than the first distance,
    wherein the pixel defining layer comprises an inorganic material.

2. The method of claim 1,
    wherein the forming of the organic layer comprises:
    forming a first layer comprising an organic material on the substrate;
    arranging a mask on the first layer, the mask comprising a transparent portion, a light-blocking portion, a first semi-transparent portion, and a second semi-transparent portion having a greater light transmittance from that of the first semi-transparent portion; and
    exposing the first layer to light through the mask,
    wherein the first semi-transparent portion is in the display area, and
    the second semi-transparent portion is in the pad area.

3. The method of claim 1, wherein the forming of the second electrode comprises forming the second electrode on the pixel defining layer on the protrusion.

4. The method of claim 1, wherein the first electrode is formed after forming the organic layer.

5. The method of claim 1, wherein the pixel defining layer comprises an inner side surface defining the opening portion, and
    the forming of the pixel defining layer comprises forming an angle between the inner side surface of the pixel defining layer and an upper surface of the substrate to be 40 degrees or less.

6. The method of claim 1, wherein the forming of the pixel defining layer comprises:
    forming an inorganic layer on the first electrode and the organic layer;
    forming the opening portion by etching the inorganic layer; and
    etching at least a portion of the central portion of the first electrode.

7. The method of claim 1, wherein the pixel defining layer comprises at least one of silicon nitride ($SiN_x$) and silicon oxide ($SiO_2$).

8. The method of claim 1, wherein the organic layer consists essentially of an acrylic polymer.

\* \* \* \* \*